United States Patent
Kanter et al.

(10) Patent No.: US 12,009,840 B2
(45) Date of Patent: Jun. 11, 2024

(54) SYSTEMS AND METHODS OF DECODING ERROR CORRECTION CODE OF A MEMORY DEVICE WITH DYNAMIC BIT ERROR ESTIMATION

(71) Applicant: Kioxia Corporation, Tokyo (JP)

(72) Inventors: Ofir Kanter, Tel Aviv (IL); Avi Steiner, Kiriat Motzkin (IL); Yasuhiko Kurosawa, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/569,007

(22) Filed: Jan. 5, 2022

(65) Prior Publication Data

US 2023/0216526 A1 Jul. 6, 2023

(51) Int. Cl.
*H03M 13/37* (2006.01)
*H03M 13/01* (2006.01)
*H03M 13/15* (2006.01)
*H03M 13/43* (2006.01)

(52) U.S. Cl.
CPC ... *H03M 13/3715* (2013.01); *H03M 13/3707* (2013.01); *H03M 13/015* (2013.01); *H03M 13/1575* (2013.01); *H03M 13/43* (2013.01)

(58) Field of Classification Search
CPC .................. H03M 13/3715; H03M 13/3707
See application file for complete search history.

(56) References Cited

U.S. PATENT DOCUMENTS

| | | | | |
|---|---|---|---|---|
| 4,201,976 | A * | 5/1980 | Patel | G11B 20/1833 |
| 8,719,677 | B2 * | 5/2014 | Alrod | G06F 11/1048 |
| | | | | 714/766 |
| 9,294,132 | B1 * | 3/2016 | Peleato-Inarrea | |
| | | | | H03M 13/3927 |
| 10,158,380 | B2 * | 12/2018 | Sharon | G06F 11/1012 |
| 11,025,283 | B1 * | 6/2021 | Lu | H03M 13/1108 |
| 2018/0032396 | A1 * | 2/2018 | Sharon | H03M 13/3738 |
| 2018/0157551 | A1 * | 6/2018 | Ryabinin | G06F 1/3206 |
| 2018/0159555 | A1 * | 6/2018 | Ryabinin | H03M 13/3715 |
| 2018/0159556 | A1 * | 6/2018 | Dumchin | H03M 13/6511 |

* cited by examiner

*Primary Examiner* — Joseph D Torres
(74) *Attorney, Agent, or Firm* — Foley & Lardner LLP

(57) ABSTRACT

A method, of decoding error correction code of a memory device with dynamic bit error estimation, can include generating at least one metric corresponding to one or more syndromes associated with a code word, the code word comprising an error correction code of a memory device, decoding the code word by a first decoder integrated with the memory device, in response to a determination that the metric satisfies a threshold associated with the syndromes, the first decoder having a first execution property, and decoding the code word by a second decoder integrated with the memory device, in response to a determination that the metric does not satisfy the threshold associated with the syndromes, the second decoder having a second execution property distinct from the first execution property, or in response to a determination that the metric satisfies the threshold associated with the syndromes, and in response to a determination to perform further decoding.

17 Claims, 14 Drawing Sheets

SYSTEMS AND METHODS OF DECODING ERROR CORRECTION CODE OF A MEMORY DEVICE WITH DYNAMIC BIT ERROR ESTIMATION

TECHNICAL FIELD

The present implementations relate generally to error correction in memory devices, and more particularly to decoding error correction code of a memory device with dynamic bit error estimation.

BACKGROUND

Flash memory devices (e.g., NAND flash memory devices) enable page reads based on voltage thresholds of the flash memory devices. Due to different noise (e.g., NAND noise) and interference sources during programming and read, errors on information bits stored in flash memory devices can occur. Such errors may be due to one or more of programming errors, reads with non-optimal thresholds, retention/read-disturb stresses, and so on. A strong error correction code (ECC) can allow fast programming (with possibly high programming errors) and reads under high stress conditions and/or with low-complexity digital signal processing (DSP). Due to the high volume of operations associated with flash memory devices, error correction operations can aggregate to introduce significant effects on performance of flash memory. Effects can include reduction in throughput and ultimately, speed of operation. Conventional systems can increase error correction capability at the expense of throughput. Thus, it is desirable to maximize memory device performance including throughput, and to minimize effects on memory device performance introduced by error correction.

SUMMARY

Example implementations are directed to methods and systems for estimating one or more of a probability and magnitude of probable failure associated with a code word of a memory device, and selecting and executing a decoder on the code based on the estimate. Thus, decoding can be optimized for particular code words based on likelihood of a particular decoder of decoding the code word with minimal impact on memory device resources. A memory device can include multiple decoders each operable to decode a code word at varying levels of speed and varying level of error correction capability, for example. An error correction capability can include, for example, a maximum number of failed or erroneous bits correctable by a particular decoder. The memory device can also include a controller operable to select a particular decoder based on one or more thresholds corresponding to one or more of a probability and magnitude of probable failure associated with a particular code word being decoded. Thus, present implementations can execute one or more error correction operations on a particular code word based on the likelihood of a particular decoder to successfully decode a code word. Present implementations can forego operations by a decoder with a low likelihood of successfully decoding the code word and operations by a decoder with a high likelihood of successfully decoding the code word, but a high computational or time cost, for example, with respect to the particular code word.

In accordance with example implementations, a technical solution of efficient error correction in a memory device based on one or more characteristics of a particular received code word. A memory device can include or be associated with a plurality of decoder devices, each having one or more distinct operating characteristics. The operating characteristics can include one or more of decoder complexity, decoder power, decoder latency, and error correction capability. Each decoder, can for example, have differing levels of one or more of these characteristics. A controller of the memory device can determine one or more characteristics associated with a code word, and can determine one or more decoders to decode the code word based on one or more of the above characteristics with respect to the code word. The memory device can operate more quickly with, for example, lower latency and fewer redundant decoding operations, by identifying the correct decoder or decoders to apply to a particular code word. Thus, a technological solution for decoding error correction code of a memory device with dynamic bit error estimation is provided. Technical improvements of the present implementations include at least improving average power consumption and average throughput of ECC decoding, and concurrently obtaining higher error correction capability under a maximum latency restriction associated with a decoding process for a code word.

A method of decoding error correction code of a memory device with dynamic bit error estimation, can include generating at least one metric corresponding to one or more syndromes associated with a code word, the code word including an error correction code of a memory device, decoding the code word by a first decoder integrated with the memory device, in response to a determination that the metric satisfies a threshold associated with the syndromes, the first decoder having a first execution property, and decoding the code word by a second decoder integrated with the memory device, in response to a determination that the metric does not satisfy the threshold associated with the syndromes, the second decoder having a second execution property distinct from the first execution property, or in response to a determination that the metric satisfies the threshold associated with the syndromes, and in response to a determination to perform further decoding.

A method can include a metric that corresponds to a number of syndromes associated with the code word and corresponding to a failure state.

A method can include a metric that corresponds to a number of syndromes associated with the code word and corresponding to a solvable state.

A method can include generating at least one second metric corresponding to the syndromes associated with the code word, and decoding the code word by the first decoder, in response to the determination that the metric satisfies the threshold, and in response to a determination the second metric satisfies a second threshold.

A method can include a metric that corresponds to a number of syndromes associated with the code word and corresponding to a failure state, and a second metric that corresponds to a number of syndromes associated with the code word and corresponding to a solvable state.

A method can include decoding the code word by the second decoder, in response to the determination that the metric does not satisfy the threshold, in response to a determination that the metric satisfies a third threshold, and in response to a determination the second metric satisfies a fourth threshold.

A method can include decoding the code word by a third decoder integrated with the memory device, in response to a determination that the metric does not satisfy the threshold, in response to a determination that the metric does not satisfy the third threshold, in response to a determination the second metric does not satisfy the second threshold and in response to a determination the second metric does not satisfy the fourth threshold, the third decoder having a third execution property distinct from the first execution property and the second execution property.

A method can include a first execution property that corresponds to a first latency associated with the first decoder, and a second execution property that corresponds to a second latency associated with the second decoder, the first latency being less than the second latency.

A method can include an execution property that corresponds to a first bit correction capability associated with the first decoder, and a second execution property that corresponds to a second bit correction capability associated with the second decoder, the first latency being less than the second latency.

A system, to decode error correction code of a memory device with dynamic bit error estimation, can include a controller to generate at least one metric corresponding to one or more syndromes associated with a code word, the code word including an error correction code of a memory device, a first decoder integrated with the memory device, to decode the code word in response to a determination that the metric satisfies a threshold associated with the syndromes, the first decoder having a first execution property, and a second decoder integrated with the memory device, to decode the code word in response to a determination that the metric does not satisfy the threshold associated with the syndromes, or in response to a determination that the metric satisfies the threshold associated with the syndromes, and in response to a determination to perform further decoding, the second decoder having a second execution property distinct from the first execution property.

A system can include a metric that corresponds to a number of syndromes associated with the code word and corresponding to a failure state.

A system can include a metric that corresponds to a number of syndromes associated with the code word and corresponding to a solvable state.

A system can include a controller to generate at least one second metric corresponding to the syndromes associated with the code word, and a first decoder to decode the code word in response to the determination that the metric satisfies the threshold, and in response to a determination the second metric satisfies a second threshold.

A system can include a metric that corresponds to a number of syndromes associated with the code word and corresponding to a failure state, and the second metric corresponds to a number of syndromes associated with the code word and corresponding to a solvable state.

A system can include a second decoder is further configured to decode the code word in response to the determination that the metric does not satisfy the threshold, in response to a determination that the metric satisfies a third threshold, and in response to a determination the second metric satisfies a fourth threshold.

A system can include a third decoder integrated with the memory device to decode the code word in response to a determination that the metric does not satisfy the threshold, in response to a determination that the metric does not satisfy the third threshold, in response to a determination the second metric does not satisfy the second threshold and in response to a determination the second metric does not satisfy the fourth threshold, the third decoder having a third execution property distinct from the first execution property and the second execution property.

A system can include a first execution property that corresponds to a first latency associated with the first decoder, and a second execution property that corresponds to a second latency associated with the second decoder, the first latency being less than the second latency.

A system can include a first execution property that corresponds to a first bit correction capability associated with the first decoder, and a second execution property that corresponds to a second bit correction capability associated with the second decoder, the first latency being less than the second latency.

A computer readable medium including one or more instructions stored thereon and executable by a processor to generate, by the processor, at least one metric corresponding to one or more syndromes associated with a code word, the code word including an error correction code of a memory device, decode, by the processor, the code word by a first decoder integrated with the memory device, in response to a determination that the metric satisfies a threshold associated with the syndromes, the first decoder having a first execution property, and decode, by the processor, the code word by a second decoder integrated with the memory device, in response to a determination that the metric does not satisfy the threshold associated with the syndromes, the second decoder having a second execution property distinct from the first execution property, or in response to a determination that the metric satisfies the threshold associated with the syndromes, and in response to a determination to perform further decoding.

Present implementations can include a computer readable medium that further includes one or more instructions executable by the processor to generate at least one second metric corresponding to the syndromes associated with the code word, and decode the code word by the first decoder, in response to the determination that the metric satisfies the threshold, and in response to a determination the second metric satisfies a second threshold.

BRIEF DESCRIPTION OF THE DRAWINGS

These and other aspects and features of the present implementations will become apparent to those ordinarily skilled in the art upon review of the following description of specific implementations in conjunction with the accompanying figures, wherein.

DETAILED DESCRIPTION

Figure 1:
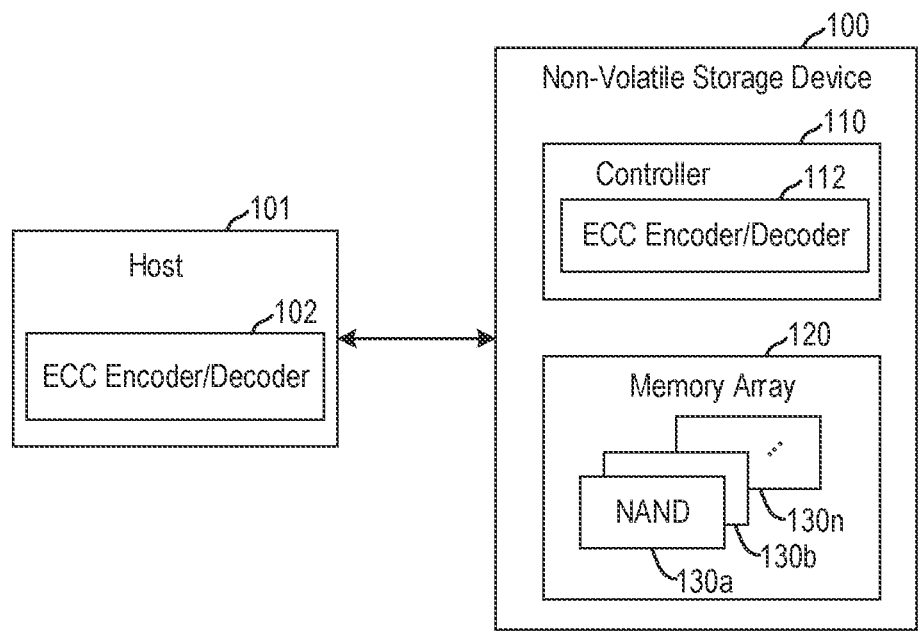
FIG. 1 illustrates a system including a non-volatile storage device and a host, in accordance with present implementations.

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation, but other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. Implementations described as being implemented in software should not be limited thereto, but can include implementations implemented in hardware, or combinations of software and hardware, and vice-versa, as will be apparent to those skilled in the art, unless otherwise specified herein. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

Present implementations can estimate a failure metric corresponding to one or more particular code words in advance of decoding the code word. As one example, a metric can include at least one of a bit error rate (BER) or fail bit count (FBC). Failure estimation can be based on a pre-decoding phase associated with preparing the code word for decoding. Thus, additional latency or hardware for failure estimation can be minimized or eliminated. As one example, a pre-decoding phased can include syndrome calculation, and failure metric calculation can be based at least partially on syndrome calculation performed to decode a code word. Failure estimation in accordance with present implementations increases resolution. Based on the resolution of the failure estimation and according to the failure metric, decoder complexity can be configured and matched to the actual BER of FBC of each code word. It is to be understood that present implementations can be implemented in or by, but are not limited to, electronic devices including digital or analog logical components.

Thus, present implementations can provide efficient failure estimation based on low latency decoder pre-processing. BER estimation can be performed during syndrome calculation, and can include, for up to every calculated syndrome, a check for the existence of an existing solution. The calculation can thus be performed efficiently by receiving input from syndrome calculation cells. Failure estimation can thus provide sufficient resolution to estimate BER or FBC and select a highly efficient decoder device, including specifically at higher ranges of BER or FBC, where conventional system lack sufficient granularity to differentiate between probabilities and identify decoders tailored to code words with high failure probabilities. As one example, the total number of syndromes with existing solutions can be input to failure estimation and decoder selection in accordance with a dynamic decoder selection policy. The dynamic decoder selection policy can include one or more thresholds associated with, for example, a memory device or a controller of the memory device, and corresponding to one or more BER or FBC values. A dynamic decoder selection policy can allow the controller to select the correct decoder complexity at the pre-processing stage, to efficiently allocate decoding resources to maximize likelihood of successfully decoding the code word and minimize computational resources and latency, for example, associated with the decoding of the code word.

Thus, technical improvements of the technical solutions of present implementations can include reduced power consumption by the memory device based on selection of more power-efficient decoders, lower latency decoders, and decoders with higher error correction capability. The dynamic decoder selection policy can be based on one or characteristics of one or more decoders, and is not limited to the examples discussed above.

FIG. 1 illustrates a system including a non-volatile storage device and a host, in accordance with present implementations. To assist in illustrating the present implementations, FIG. 1 shows a block diagram of a system including a non-volatile storage device 100 coupled to a host 101 according to some implementations. In some examples, the host 101 can be a user device operated by a user. The host 101 may include an operating system (OS), which is configured to provision a filesystem and applications which use the filesystem. The filesystem communicates with the non-volatile storage device 100 (e.g., a controller 110 of the non-volatile storage device 100) over a suitable wired or wireless communication link or network to manage storage of data in the non-volatile storage device 100. In that regard, the filesystem of the host 101 sends data to and receives data from the non-volatile storage device 100 using a suitable interface to the communication link or network.

In some examples, the non-volatile storage device 100 is located in a datacenter (not shown for brevity). The datacenter may include one or more platforms, each of which supports one or more storage devices (such as but not limited to, the non-volatile storage device 100). In some implementations, the storage devices within a platform are connected to a Top of Rack (TOR) switch and can communicate with each other via the TOR switch or another suitable intra-platform communication mechanism. In some implementations, at least one router may facilitate communications among the non-volatile storage devices in different platforms, racks, or cabinets via a suitable networking fabric. Examples of the non-volatile storage device 100 include but are not limited to, a solid state drive (SSD), a non-volatile dual in-line memory module (NVDIMM), a Universal Flash Storage (UFS), a Secure Digital (SD) device, and so on.

The non-volatile storage device 100 includes at least a controller 110 and a memory array 120. Other components of the non-volatile storage device 100 are not shown for brevity. The memory array 120 includes NAND flash memory devices 130a-130n. Each of the NAND flash memory devices 130a-130n includes one or more individual NAND flash dies, which are non-volatile memory (NVM) capable of retaining data without power. Thus, the NAND flash memory devices 130a-130n refer to multiple NAND flash memory devices or dies within the flash memory device 100. Each of the NAND flash memory devices 130a-130n includes one or more dies, each of which has one or more planes. Each plane has multiple blocks, and each block has multiple pages.

While the NAND flash memory devices 130a-130n are shown to be examples of the memory array 120, other examples of non-volatile memory technologies for implementing the memory array 120 include but are not limited to, dynamic random access memory (DRAM), magnetic random access memory (MRAM), phase change memory (PCM), ferro-electric RAM (FeRAM), and so on. The ECC structure described herein can be likewise implemented on memory systems using such memory technologies and other suitable memory technologies.

Examples of the controller 110 include but are not limited to, an SSD controller (e.g., a client SSD controller, a datacenter SSD controller, an enterprise SSD controller, and so on), a UFS controller, or an SD controller, and so on.

The controller 110 can combine raw data storage in the plurality of NAND flash memory devices 130a-130n such that those NAND flash memory devices 130a-130n function as a single storage. The controller 110 can include microcontrollers, buffers, error correction systems, flash translation layer (FTL) and flash interface modules. Such functions can be implemented in hardware, software, and firmware or any combination thereof. In some arrangements, the software/firmware of the controller 110 can be stored in the non-volatile storage 120 or in any other suitable computer readable storage medium.

The controller 110 includes suitable processing and memory capabilities for executing functions described herein, among other functions. As described, the controller 110 manages various features for the NAND flash memory devices 130a-130n including, but not limited to, I/O handling, reading, writing/programming, erasing, monitoring, logging, error handling, garbage collection, wear leveling, logical to physical address mapping, data protection (encryption/decryption), ECC capabilities, and the like. Thus, the controller 110 provides visibility to the NAND flash memory devices 130a-130n.

The error correction systems of the controller 110 can include or otherwise implement one or more ECC encoders and one or more ECC decoders, collectively referred to as an ECC encoder/decoder 112. The ECC encoders of the ECC encoder/decoder 112 are configured to encode data (e.g., input payload) to be programmed to the non-volatile storage 120 (e.g., to the NAND flash memory devices 130a-130n) using the ECC structures described herein. The ECC decoders of the ECC encoder/decoder 112 are configured to decode the encoded data to correct programming errors, errors caused by reading with non-optimal thresholds, errors caused by retention/read-disturb stresses, and so on, in connection with a read operation. To enable low-complexity processing, the ECC encoder/decoder 112 is implemented on hardware and/or firmware of the controller 110.

In some implementations, the host 101 includes an ECC encoder/decoder 102 that can use the ECC structures described herein. The ECC encoder/decoder 102 is software running on the host 101 and includes one or more ECC encoders and one or more ECC decoders. The ECC encoders of the ECC encoder/decoder 102 are configured to encode data (e.g., input payload) to be programmed to the non-volatile storage 120 (e.g., to the NAND flash memory devices 130a-130n) using the ECC structures described herein. The ECC decoders of the ECC encoder/decoder 102 are configured to decode the encoded data to correct errors, in connection with a read operation. In some arrangements, one of the ECC encoder/decoder 102 or the ECC encoder/decoder 112 employs the ECC structures described herein. In some arrangements, one of the ECC encoder/decoder 102 or the ECC encoder/decoder 112 employs the hard decoding methods described herein. In some implementations, the ECC encoders of the ECC encoder/decoder 102 are configured to encode data (e.g. input payload) to be written to multiple instances of the non-volatile storage device 100 using a redundancy code, examples including, but not limited to, erasure codes and RAID levels 0-6.

An encoding scheme such as the HFPC encoding scheme can be used to encode each of the plurality of short code words. In some arrangements, the HFPC code structure is composed of multiple component codes. Each component code can be, for example, a BCH code. A turbo code can be built of multiple code components, where each code component can be for example a BCH code. A number of components code n can be determined by the correction capability of each component code and code rate. For example, given a minimum distance $D_{min}$ per component code, the correction capability t of each component code can be represented by:

$$t=(D_{min}-1)/2 \quad (1),$$

where the $D_{min}$, of a linear block code is defined as the smallest Hamming distance between any pair of code vectors in the code. The number of redundancy bits r can be represented by:

$$r=Q\cdot(D_{min}-1)/2 \quad (2),$$

where Q is a Galois field parameter for the BCH component code defined over $GF(2^Q)$. Given a code rate R and payload length K bits, a number of component codes needed can be determined by:

$$n = \left\lfloor K \cdot \frac{1-R}{r \cdot R} \right\rfloor; \text{ or} \qquad (3)$$

$$n = \left\lfloor 2K \cdot \frac{1-R}{Q \cdot (D_{min} - 1) \cdot R} \right\rfloor. \qquad (4)$$

In some examples, input payload bits (e.g., including the information bits and the signature bits) are arranged in a pseudo triangular matrix form and to perform folded encoding (e.g., folded BCH encoding) for every component code. In some examples, every bit in a payload (e.g., every information bit) can be encoded by (at least) two component codes (also referred to as "code components"), and each component code intersects with all other component codes. That is, for component codes that encode the information bits, the encoding process is performed such that systematic bits of every component code is also encoded by all other component codes. The component codes together provide encoding for every information bit using the component codes.

Figure 2:
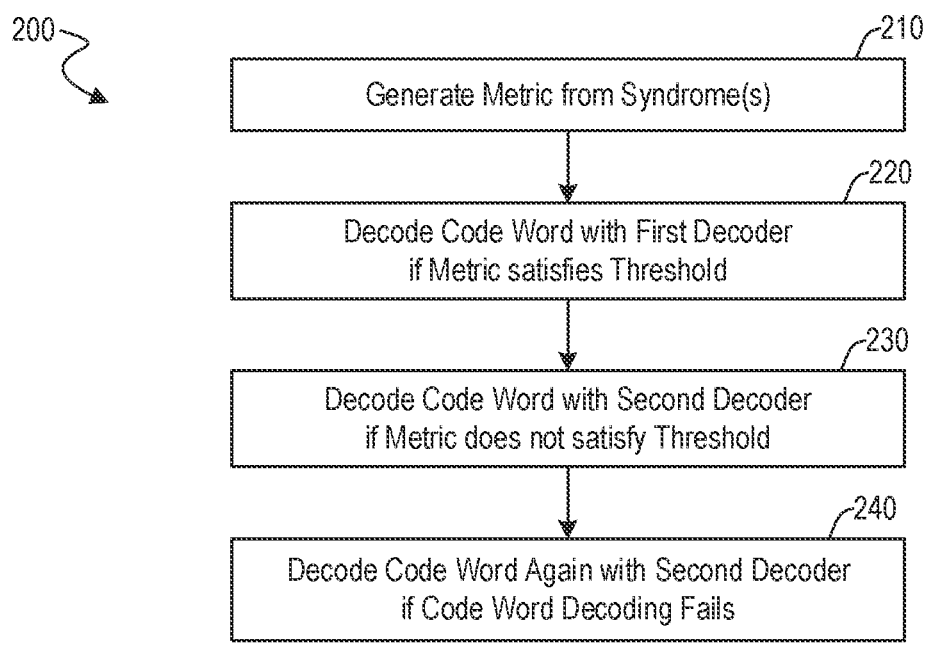
FIG. 2 illustrates a method of decoding error correction code of a memory device with dynamic bit error estimation, in accordance with present implementations.

FIG. 2 illustrates a method of decoding error correction code of a memory device with dynamic bit error estimation, in accordance with present implementations. In some implementations, at least one of the non-volatile storage device 100 and the host 101 performs method 200 according to present implementations. Failure estimation can be implemented during a pre-decoding phase for decoding a code word, and can provide accurate results to adjust decoder complexity based on the failure estimation. The method 200 can be performed dynamically, in real time for each code-word to obtain efficient decoding of each code word with respect to one or more performance characteristics associated with the memory devices or one or more decoders.

At step 210, the method can generate at least one metric based on at least one syndrome corresponding to a code word. The metric can include a quantitative value or result, for example, corresponding to the failure estimation associated with the code word. As discussed above, the failure estimation can be at least partially based on the syndromes calculated for the code word. The method 200 can then continue to step 220.

At step 220, the method can decode the code word with a first decoder if the metric satisfies a threshold. The method can decode the code word in accordance with a first predetermined decoder in response to a determination that the metric satisfies the threshold. As one example, the threshold can correspond to a minimum or maximum quantitative value or result, for example, corresponding to the failure estimation associated with the code word. The first decoder can be or include a decoder having a first latency and a first bit error correction capability, for example. The method 200 can then continue to step 230.

At step 230, the method can decode the code word with a second decoder if the metric does not satisfy the threshold. The method can decode the code word in accordance with a second predetermined decoder in response to a determination that the metric does not satisfy the threshold. The second decoder can be or include a decoder having a second latency higher than the first latency and a second bit error correction capability higher than the first bit error correction capability, for example. The method 200 can then continue to step 240.

At step 240, the method can decode the code word again with the second decoder, in response to a failure of the decoding of the code word. The method can reattempt to decode the code word with the decoder having higher bit error correction capability, if the first attempt or a preceding attempt resulted in failure to successfully decode the code word. The method can reattempt decoding of 240. As one example, the method can reattempt until an error threshold corresponding to a maximum number of decoding attempts, is reached. The method 200 can end at step 240.

Figure 3:
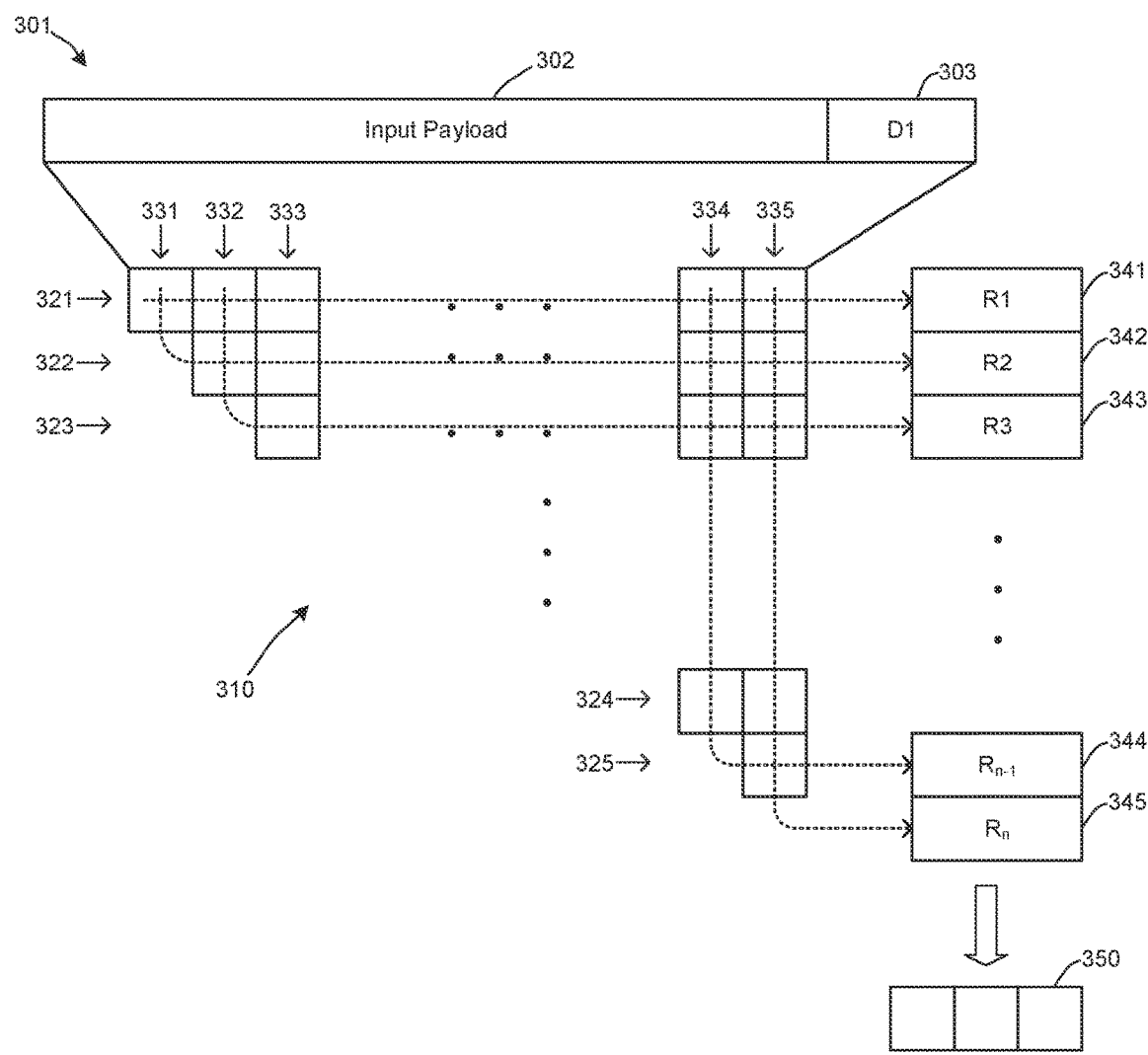
FIG. 3 illustrates a memory device error correction mapping in an error process using a first example code structure, in accordance with present implementations.

FIG. 3 illustrates a memory device error correction mapping in an error process using a first example code structure, in accordance with present implementations. FIG. 3 is a diagram illustrating a mapping 300 in an encoding process using a HFPC structure according to various implementations. The controller 110 (e.g., one or more ECC encoders of the ECC encoder/decoder 112) or the host 101 (e.g., one or more ECC encoders of the ECC encoder/decoder 102) can include or can otherwise implement an HFPC interleaver configured to organize (e.g., interleave or map) input bits 301 into a form of a pseudo triangular matrix 310. The input bits 301 include input payload 302 and signature bit(s) D1 303 in some examples. The input payload 302 includes the information bits. In some examples, the input payload 302 includes information bits and redundancy bits introduced by the host 101 for RAID or erasure encoding (e.g. by the one or more ECC encoders of the ECC encoder/decoder 102). As described, an example of D1 303 is the extra CRC bits. The bits of D1 303 can also be referred to as "outer parity bits," given that CRC encoding can be viewed as an outer encoding process. The mapping from the input bits 301 to the pseudo triangular matrix 310 is maintained by the controller 110.

As shown, the pseudo triangular matrix 310 has an upper triangular form, which has rows 321-325 (with rows between rows 323 and 324 omitted for clarity) and column 331-335 (with columns between columns 333 and 334 omitted for clarity). The pseudo triangular matrix 310 is shown to have multiple blocks. Each block in the pseudo triangular matrix 310 includes or otherwise represents two or more bits of the input bits 301. The number of input bits per each block can be predetermined and equal for all the blocks of the pseudo triangular matrix 310. Therefore, the HFPC is obtained by allowing any pair of component codes to encode (e.g., intersect at) more than one bit. Conventionally, any pair of components HFPC intersect by only one common (intersection) bit. The disclosed implementations allow intersection of two or more common bits for any pair of component codes. The pseudo triangular matrix 310 is "pseudo" given that each row has two or more bits (e.g., a block) more than the row immediately below that row, and each column has two or more bits (e.g., a block) more than the column immediately to its left. Thus, each row or column of the pseudo triangular matrix differs from an adjacent row or column by two or more bits.

In some implementations, the input bits 301 are mapped to a block in the pseudo triangular matrix 310 consecutively (by any suitable order). For example, the rows 321-325, in that order or in a reverse order, can be filled by the input bits 301 consecutively block by block, from the left-most block of a row to a right-most block of a row, vice versa. In another example, the columns 331-335, in that order or in a reverse order, can be filled by the input bits 301 consecutively block by block, from the top-most block of a column to a bottom-most block of a row, vice versa. In some implementations, the input bits 301 are mapped to the pseudo triangular matrix 310 pseudo-randomly. In other implementations, the input bits 301 can be mapped to the pseudo triangular matrix 310 using another suitable mapping mechanism. In one arrangement, the mapping is a one to one mapping, where each bit of the input bits 301 is mapped to one bit of the pseudo triangular matrix 310 and the total number of bits in the pseudo triangular matrix 310 is equal to the number of input bits 301. In another arrangement, the mapping may be one to many, where each bit of the input bits 301 is mapped to one or more bits of the pseudo triangular matrix 310 and the total number of bits in the pseudo triangular matrix 310 is greater than the number of input bits 301.

As shown, the upper triangular form has a same number of columns and a same number of rows. In the upper triangular form, the row 321 contains the most bits out of all the rows in the pseudo triangular matrix 310. The row 322 has one less block than the row 321. The row 323 has one less block than the row 322, and so on. The row 324 has two blocks, and the row 325, being the lowest row, has one block. In other words, any row in the pseudo triangular matrix 310 (except for the row 321) has one block less than the row immediately above. Similarly, in the upper triangular form, the column 331, being the left-most column, has one block. The column 332 has one more block than the column 331. The column 333 has one more block than the column 332, and so on. The column 335, being the right-most column, has the most blocks out of the columns in the pseudo triangular matrix 310. In other words, any column in the pseudo triangular matrix 310 (except for the column 335) has one block less than the column immediately to the right.

Organizing or mapping the input bits 301 (which includes the bits of the input payload 302 and signature bit(s) D1 303) in the upper triangular form of the pseudo triangular matrix 310 allows every component code to be associated with bits in a row and a column that have the same size or nearly the same size in the manner described. For example, R1 341 represents redundancy bits corresponding to a first component code. R1 341 redundancy bits are obtained by encoding (e.g., folded component encoding) the input bits 301 in a first row (e.g., the bits in the row 321). R2 342 redundancy bits are obtained by encoding (e.g., via folded component encoding) the input bits 301 in a first column (e.g., the bits in the column 331) and the second row (e.g., the bits in the row 322). The number of total bits (e.g., the bits in the column 331 plus the bits in the row 322) encoded by R2 342 are the same as the number of total bits (e.g., the bits in the row 321) encoded by R1 341. R3 343 redundancy bits are obtained by encoding (e.g., via folded component encoding) the input bits 301 in a second column (e.g., the bits in the column 332) and the third row (e.g., the bits in the row 323). The number of total bits (e.g., the bits in the column 332 plus the bits in the row 323) encoded by R3 343 are the same as the number of total bits encoded by R2 342 (as well as the number of total bits encoded by R1 341). This process continues to obtain the last redundancy bits Rn 345, which encodes (e.g., via folded component encoding) the input bits 301 in the last column (e.g., the bits in the column 335). Thus, each component code encodes a row and a column in the pseudo triangular matrix 310, providing folded component encoding. An example of the folded component encoding is folded BCH encoding.

In other words, according to the mapping 300, the input bits 301 are mapped to the component codes of the ECC and are encoded as the mapped component codes. For example, the encoding process organizes or maps the input bits 301 into a matrix (e.g., the pseudo triangular matrix form), and performs folded BCH encoding for every component code. Each of the input bits 301 is encoded by two component codes. Each component code intersects with all other component codes. For component codes that encode the input bits 301, the encoding process is performed such that the systematic bits of every component code is also encoded by all other component codes. The input bits encoded by any of the component codes are also encoded by every other component code in the ECC in a non-overlapping manner.

For example, the bits encoded by the component code corresponding to R3 343 redundancy bits are also encoded by other component codes corresponding to R1 341, R2 342, and R4-Rn 345. The bits at intersection of the row 321 and the column 332 are also encoded by the component code corresponding to R1 341; the bits at the intersection of the row 322 and the column 332 are also encoded by the component code corresponding to R2 342; the bits at the intersection of the row 323 and the column 334 are also encoded by the component code corresponding to Rn-1 344; the bits at the intersection of the row 323 and the column 335 are also encoded by the component code corresponding to Rn 345. Each block of bits encoded by any of the component code (e.g., the component code corresponding to the R3 343) is encoded by that component code (e.g., the component code corresponding to the R3 343) and no more than another one of the component codes, hence in a non-overlapping manner. As such, every component code is mutually dependent on all other component codes. The component codes together provide the encoding of each of the input bits 301 using two component codes. The component codes have the same code rate given that each component code encodes a same number of bits.

In some implementations, parity bits can be generated via parity encoding. For example, folded parity encoding can be used to encode at least a portion of each of R1 341-Rn 345 into another component code (e.g., a folded product code 350, which is a set of packets). The folded product code 350 is comprised of the parity bits. This method of generating the parity bits can be efficient for obtaining simple hardware encoding implementations of HFPC, as the method can be iteratively decoded using various methods of hard or soft decoding.

In some examples, to provide an efficient structure, an incomplete portion (e.g., not an entirety) of each of R1 341-Rn 345 is encoded to obtain the folded product code 350. This is because only the encoded versions of the input bits 301 (e.g., the input payload 302) needs to be decoded—decoding all of the redundancy bits R1 341-Rn 345 may prolong decoding time.

In some arrangements, a number of component codes used for encoding the redundancy bits can change depending on code rate and intersection size needed for the redundancy bits. In some arrangements, the redundancy bits may not be encoded at all, resulting irregular degrees of protection for the bits within the code word. The irregular degrees of protection can be useful in some cases in terms of its waterfall capability. In some arrangements, the degree of protection for some information bits can be more than two by leveraging irregular half folded-product code encoding. For example, in addition to encoding the regular half folded-product code as described with reference to FIGS. 3, an additional encoding process can be applied to some of the input bits 301 by encoding those bits with a different set of component codes. In some examples, the irregularity of the encoding process is caused by some of the input bits 301 being encoded by more than two component codes while other bits of the input bits 301 are encoded by two component codes, creating an unequal error protection of the bits within the code word and resulting in improved correction capabilities (as applied to iterative decoding).

The redundancy bits R1 341-Rn-m 345 generated from the HFPC encoding process described with respect to FIG.

3 can be encoded by another, separate set of component codes used to encode all or a subset of these redundancy bits by another set of component codes. This forms a folded product code encoding over the redundancy bits R1 341-Rn-m 345, which, together with the information bits encoding, results in a low complexity encoding process.

As shown, the bits for each component code depend on the bits for another component code during decoding in the ECC structure corresponding to the mapping 300.

For conventional half product codes, every pair of component codes has only one common (intersection) information bit. In some implementations, a HFPC is obtained by using every pair of component codes encode more than one information bit. Accordingly, there can be two or more common (intersection) bits for every pair of component codes.

In some implementations, the redundancy bits generated from the HFPC encoding process described herein are encoded by a separate set of component codes. For example, the separate set of component codes encode all or a subset of the redundancy bits to form a folded product code that encodes over the redundancy bits, which together with the information bits encoding, results in a low complexity encoding process.

In some implementations, multiple component codes can be grouped together and function like a single element according to the HFPC structures such that no dependency exists among the bits of the component codes within each group of component codes. Such encoding scheme reduces dependency of the HFPC structure and enables faster decoding implementation in hardware given that the encoding scheme is a low-complexity encoding and decoding code structure obtained by defining groups, where each group includes independent components.

Figure 4:
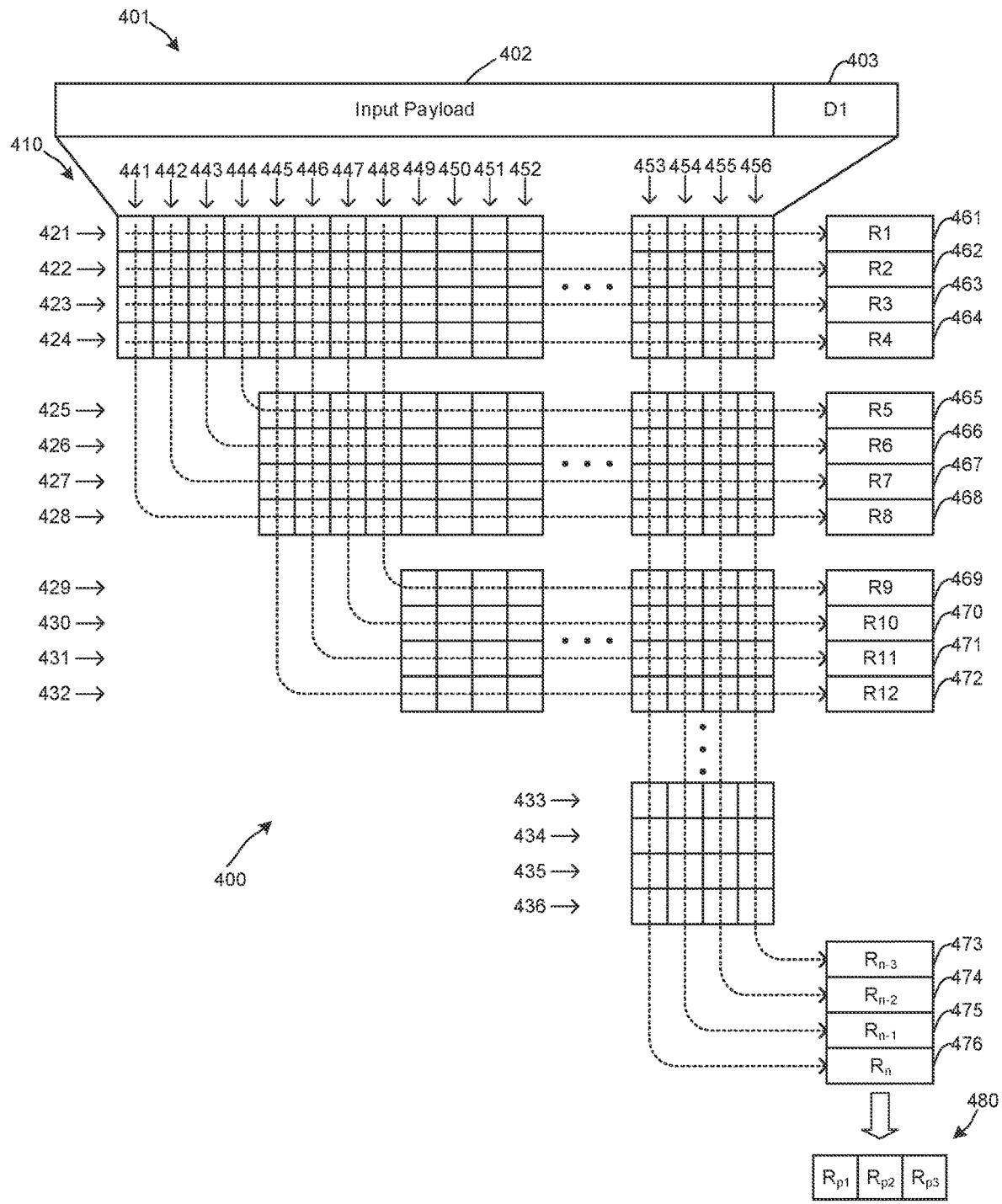
FIG. 4 illustrates a memory device error correction mapping in an error process using a second example code structure, in accordance with present implementations.

FIG. 4 illustrates a memory device error correction mapping in an error process using a second example code structure, in accordance with present implementations. FIG. 4 is a diagram illustrating a mapping 400 in an encoding process using a group HFPC structure according to various implementations. Referring to FIGS. 1-4, the mapping 400 corresponds to the group HFPC encoding scheme and is an example implementation of block 220. The HFPC interleaver of controller 110 (e.g., one or more ECC encoders of the ECC encoder/decoder 112) or the host 101 (e.g., one or more ECC encoders of the ECC encoder/decoder 102) is configured to organize (e.g., interleave) input bits 401 into a form of a pseudo triangular matrix 410. The input bits 401 includes input payload 402 and signature bit(s) D1 403 in some examples. The input payload 402 includes the information bits. As described, an example of D1 403 is the extra CRC bits (outer parity bits). The mapping from the input bits 401 to the pseudo triangular matrix 410 is maintained by the controller 110.

As shown, the pseudo triangular matrix 410 has an upper triangular form, which has rows 421-436 (with rows between rows 432 and 433 omitted for clarity) and columns 441-456 (with columns between columns 452 and 453 omitted for clarity). The pseudo triangular matrix 410 is shown to have multiple blocks. Each block in the pseudo triangular matrix 410 includes or otherwise represents two or more bits of the input bits 401. The number of input bits per each block can be predetermined and equal for all the blocks of the pseudo triangular matrix 410. The disclosed implementations allow intersection of two or more common bits for any pair of component codes.

In some implementations, the input bits 401 are mapped to blocks in the pseudo triangular matrix 410 consecutively (by any suitable order). For example, the rows 421-436, in that order or in a reverse order, can be filled by the input bits 401 consecutively block-by-block, from the left-most block of a row to a right-most block of a row, or vice versa. In another example, the columns 441-456, in that order or in a reverse order, can be filled by the input bits 401 consecutively block-by-block, from the top-most block of a column to a bottom-most block of a row, or vice versa. In some implementations, the input bits 401 are mapped to the pseudo triangular matrix 410 pseudo-randomly. In other implementations, the input bits 401 can be mapped to the pseudo triangular matrix 410 using another suitable mapping mechanism.

The blocks, rows, and columns in the pseudo triangular matrix 410 can be grouped together. For example, the pseudo triangular matrix 410 includes a first group of columns 441-444, a second group of columns 445-448, a third group of columns 449-452, . . . , and another group of columns 453-456. The pseudo triangular matrix 410 includes a first group of rows 421-424, a second group of rows 425-428, a third group of rows 429-432, . . . , and another group of rows 433-436. Thus, the HFPC structure is divided into groups of 4 component codes. Every 4 component codes are encoded according to HFPC guidelines. Although 4 component code groups (e.g., 4 rows/columns) are shown in FIG. 4, any number (e.g., 2, 3, 6, 8, 10, 12, 16, and so on) of component codes can be grouped together.

As shown, the upper triangular form has a same number of columns and a same number of rows. The rows (e.g., the rows 421-424) or columns (e.g., the columns 441-444) in a same component code group have a same number of blocks and therefore have a same number of bits. In the upper triangular form, the rows 421-424 contain the most bits out of all the rows in the pseudo triangular matrix 410. Each of the rows 425-428 has one less group of blocks (4 blocks, corresponding to the group of columns 441-444) than any of the rows 421-424. Each of the rows 429-432 has one less group of blocks (4 blocks, corresponding to the group of columns 445-448) than any of the rows 425-428, and so on. Each of the rows 433-436, being the lowest row, has a group of blocks (e.g., 4 blocks). In other words, any row in the pseudo triangular matrix 410 (except for the rows 421-424) has 4 blocks less than a row of a group immediately above. Similarly, in the upper triangular form, each of the columns 441-444, being one of the left-most columns, has a group of blocks (e.g., 4 blocks). Each of the columns 445-448 has one more group of blocks (4 blocks, corresponding to the group of rows 425-428) than any of the columns 441-444. Each of the columns 449-452 has one more group of blocks (4 blocks, corresponding to the group of rows 429-432) than any of the columns 445-448, and so on. Each of the columns 453-456, being the right-most columns, has the most number of blocks. In other words, any column in the pseudo triangular matrix 410 (except for the columns 453-456) has 4 blocks less than a column of a group immediately to the right.

Organizing or mapping the input bits 401 in the upper triangular form of the pseudo triangular matrix 410 allows every component code to be associated with bits in a row and a column that have the same size or nearly the same size in the manner described. The component codes within a same group encode separate sets of the input bits 401 and are independent of each other.

R1 461-R4 464 are redundancy bits determined based on a same group of component codes. R1 461 represents redundancy bits corresponding to a first component code and are obtained by encoding (e.g., folded component encoding)

the input bits 401 in a first row (e.g., the bits in the row 421). R2 462, R3 463, and R4 464 represent redundancy bits corresponding to additional component codes and are obtained by encoding (e.g., folded component encoding) the input bits 401 in the bits in the rows 422, 423, and 423, respectively. The bits used to determine each of R1 461-R4 464 do not overlap, and thus R1 461-R4 464 are independently determined.

R5 465, R6 466, R7 467, and R8 468 represent redundancy bits corresponding to additional component codes and are obtained by encoding (e.g., folded component encoding) the input bits 401 in the bits in the column 444 and row 425, in the column 443 and row 426, in the column 442 and row 427, and in the column 441 and row 428, respectively. The bits used to determine each of R5 465-R8 468 do not overlap, and thus R5 465-R8 468 are independently determined.

R9 469, R10 470, R11 471, and R12 472 represent redundancy bits corresponding to additional component codes and are obtained by encoding (e.g., folded component encoding) the input bits 401 in the bits in the column 448 and row 429, in the column 447 and row 430, in the column 446 and row 431, and in the column 445 and row 432, respectively. The bits used to determine each of R9 469-R12 472 do not overlap, and thus R9 469-R12 472 are independently determined.

This process continues until Rn-3 473, Rn-2 474, Rn-1 475, and Rn 476 are determined. Rn-3 473, Rn-2 474, Rn-1 475, and Rn 476 represent redundancy bits corresponding to additional component codes and are obtained by encoding (e.g., folded component encoding) the input bits 401 in the bits in the column 456, in the column 455, in the column 454, and in the column 453, respectively. The bits used to determine each of Rn-3 473, Rn-2 474, Rn-1 475, and Rn 476 do not overlap, and thus Rn-3 473, Rn-2 474, Rn-1 475, and Rn 476 are independently determined. An example of the folded component encoding is folded BCH encoding.

In the special case that the component codes are divided into two groups of independent component codes, the resulting coding scheme degenerates to a folded product code.

According to the mapping 400, the input bits 401 are mapped to the component codes of the ECC and are encoded as the mapped component codes. For example, the encoding process organizes or maps the input bits 401 in a matrix (e.g., a pseudo triangular matrix form), and performs folded BCH encoding for every component code. Each of the input bits 401 is encoded by two component codes of different component code groups. Thus, any component code intersects with all other component codes that are in the same group as the group to which that component code belongs. For component codes that encode the input bits 401, the encoding process is performed such that the systematic bits of every component code is also encoded by all other component codes that belong to different groups, with dependency within a component code group being eliminated. The input bits encoded by a given component code of the component codes are also encoded by every other component code (that is not in the same group as that component code) in a non-overlapping manner. For example, the bits encoded by the component code corresponding to R9 469 redundancy bits are also encoded by other component codes corresponding to R1 461-R8 468 and R11-Rn 476 that are not in the group in which the component code corresponding to R9 469 redundancy bits belongs. Each block of bits encoded by any of the component code (e.g., the component code corresponding to the R9 469) is encoded by that component code (e.g., the component code corresponding to the R9 469) and no more than another one of the component codes, hence in a non-overlapping manner. As such, every component code is mutually dependent on all other component codes that are not within the same group. The component codes together provide the encoding of each input bits 401 using two component codes.

In some implementations, parity bits can be generated via parity encoding. For example, folded parity encoding can be used to encode at least a portion of each of R1 461-Rn 476 into another component code (e.g., a folded product code 480, which is a set of packets). The folded product code 480 (e.g., having Rp1-Rp3) is the parity bits. This method of generating the parity bits can be efficient for obtaining simple hardware encoding implementations of HFPC, as the method can be iteratively decoded using various methods of hard or soft decoding. It is to be understood that HFPC is an example implementation in accordance with present implementations, and that present implementations are not limited to the particular code component structure discussed herein.

Figure 5:
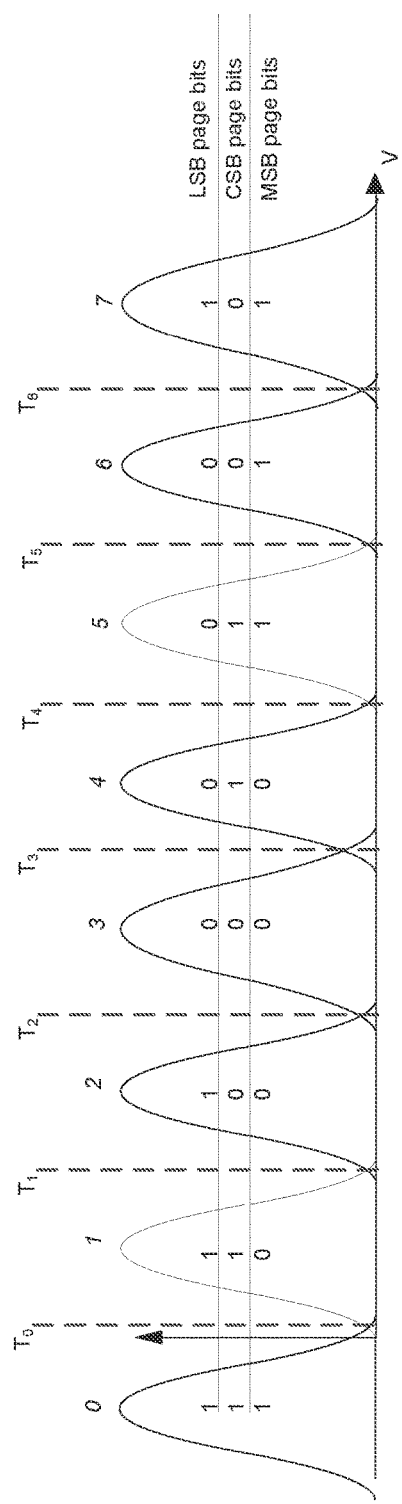
FIG. 5 illustrates a voltage threshold distribution of a three bits per cell (bpc) flash memory device, in accordance with present implementations.

FIG. 5 illustrates a voltage threshold distribution of a three bits per cell (bpc) flash memory device, in accordance with present implementations. As one example, the voltage threshold (VT) distribution includes eight lobes. An MSB page read can use thresholds T0, T4. The read thresholds T1, T3 and T5 can be used for reading CSB pages. The read thresholds T2 and T6 can be used for reading LSB pages. The lower most distribution is known as the erase level.

The lobes shown in FIG. 1 can be non-overlapping or may overlap. The overlapping can be due to the retention effect. Repeated programming and erasing of flash memory cells cause charges to be trapped in the flash memory cells. These charges can reduce the cell program time (tProg) and can introduce errors in the programming and reading processes, which can undesirably increase a bit-error-rate (BER) of the NAND flash device.

Figure 6:
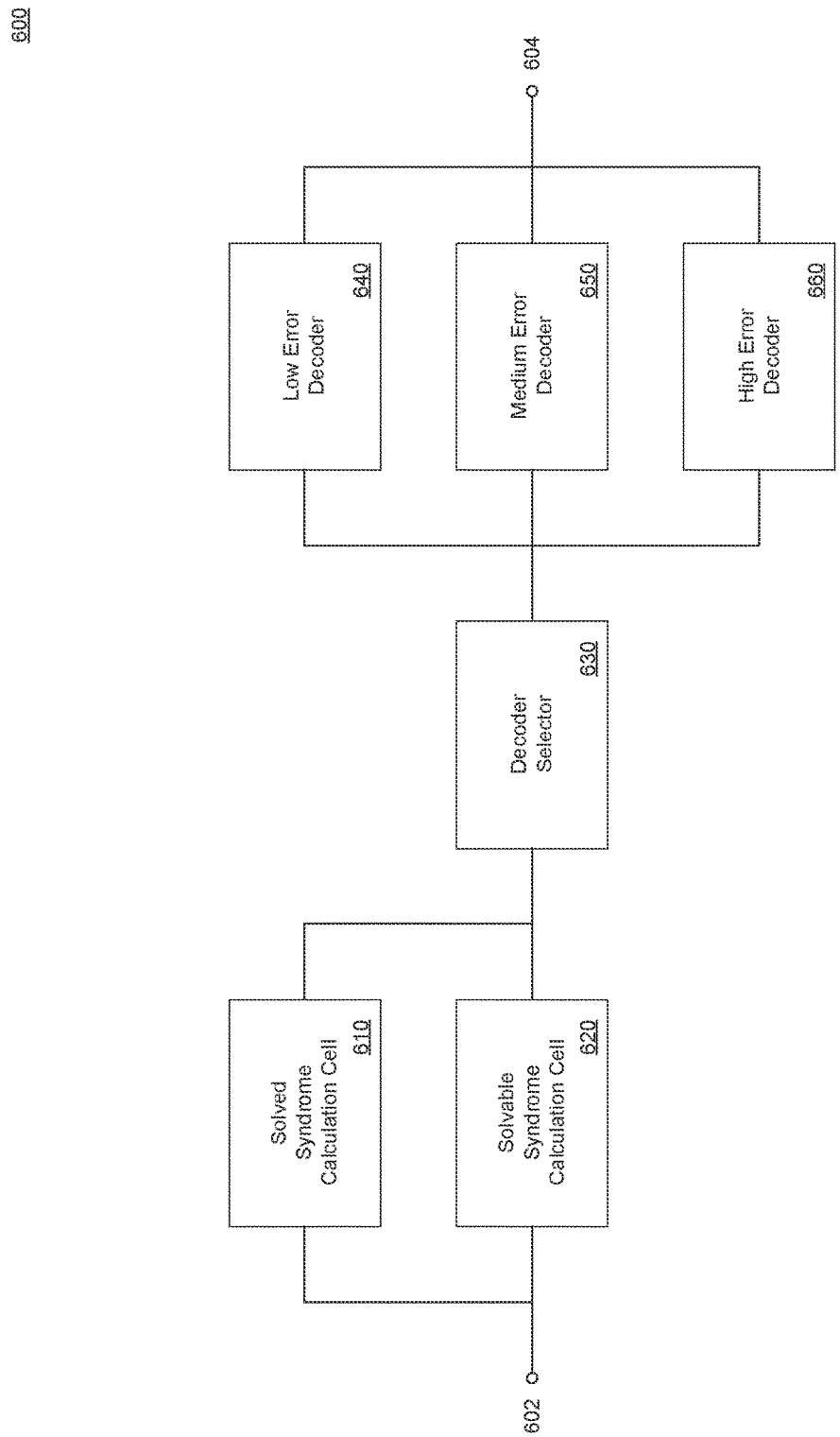
FIG. 6 illustrates a system in accordance with present implementations.

FIG. 6 illustrates a system in accordance with present implementations. As illustrated by way of example in FIG. 6, a system 600 can include an input node 602, a solved syndrome calculation cell 610, a solvable syndrome calculation cell 620, a decoder selector 630, a low error decoder 640, a medium error decoder 650, a high error decoder 60, and an output node 604. One or more components of the system 600 can, for example, be integrated with or correspond at least partially to, one or more of the controller 110 and the ECC encoder/decoder 112 of the non-volatile storage device 100. The input node 602 can be operatively coupled to a communication bus, line, or the like, for example, and can obtain at least one code word. The Input node 602 can provide the code word to one or more of the solved syndrome calculation cell and the solvable syndrome calculation cell.

The solved syndrome calculation cell 610 can generate one or more values corresponding to solved syndromes or unsolved syndromes. The values corresponding to the solved syndromes or unsolved syndromes can correspond to solutions to the syndromes. The solved syndrome calculation cell 610 can estimate the BER of the code word based on the number of unsolved syndromes. An unsolved syndrome can correspond to a value of the syndrome not equal to zero. In case that the syndrome is unsolved, a decoder can indicate one or more errors that can be fixed in the code component of the code word. In some implementations, the number of unsolved-syndromes can be calculated for any decoding process. Thus, present implementations can provide a failure estimation method with no additional latency.

The solvable syndrome calculation cell 620 can generate one or more values corresponding to a particular solution state of a particular syndrome of a code word. The solvable syndrome calculation cell 620 can generate values in accordance with one or more solution mode. The solvable syndrome calculation cell 620 can select at least one solution mode based on one or more characteristics of the code word or the input syndrome, or based at least partially on an external selection or indication, for example. A first solution mode can include a determination whether a solution exists for a particular code component. A second solution mode can include a determination whether a solution exists for a particular code component and an indication of the number of errors found in the code component. A third solution mode can include a determination whether a solution exists for a particular code component, and a determination whether the solution is valid. A fourth solution mode can include a determination whether a solution exists for a particular code component, a determination whether the solution is valid, and an indication of the number of errors found in the code component. A solution can be identified as valid when all of the roots of the solution are within the packet length of the code component. The solution modes discussed above can provide higher resolution for failure estimation, by at least providing a failure estimation capable of indicating higher BER or FBC numbers, for example. Thus, the solution mode can provide highly granular failure estimation to enable selection between decoders having capabilities optimized for uses cases within narrow ranges of failure estimation values.

Each of the solved syndrome calculation cell 610 and the solvable syndrome calculation cell 620 can include one or more logical or electronic devices including but not limited to integrated circuits, logic gates, flip flops, gate arrays, programmable gate arrays, and the like. One or more of the solved syndrome calculation cell 610 and the solvable syndrome calculation cell 620 can also be at least partially associated with, integrated with, integrable with, or the like, the controller 110, the ECC encoder/decoder 112, or any component thereof. One or more of the solved syndrome calculation cell 610 and the solvable syndrome calculation cell 620 can be at least partially integrated with a turbo decoder of the ECC encoder/decoder 112, and eliminate additional gate-count to generate solved or solvable syndrome calculations.

The decoder selector 630 can select one or more of the decoders 640, 650 and 660 based at least partially on input received from one or more of the solved syndrome calculation cell 610 and the solvable syndrome calculation cell 620. The decoder selector 630 can, for example, obtain or store one or more thresholds associated with one or more failure estimation values, and can select one or more of the decoders 640, 650 and 660 based on the thresholds. As one example, the decoder selector 630 can select the low error decoder 640 after determining that a failure estimation value associated with a particular code word is less than a numeric threshold corresponding to a particular BER or FBC. Thus, the decoder selector can select the low error decoder to 640 to decode a code word having an estimated error below a predetermined threshold. The decoder selector 630 can include one or more logical or electronic devices including but not limited to integrated circuits, logic gates, flip flops, gate arrays, programmable gate arrays, and the like. It is to be understood that any electrical, electronic, or like devices, or components associated with the decoder selector 630 can also be associated with, integrated with, integrable with, or the like, the controller 110 or any component thereof.

The low error decoder 640 can perform a decoding operation on a code word in accordance with a decoding process having one or more particular characteristics. One or more characteristics of the decoding process can depend on structure of the low error decoder 640. As one example, the low error decoder 640 can be a "fast mode" decoder, with a power consumption, latency, and complexity, all lower than corresponding features of the medium error decoder 650 and the high error decoder 660. Complexity can correspond to a number of gates implementing the decoder operation of a particular decoder, including any of the decoders 640, 650 and 660. In order to achieve the above improvements and efficiencies in power, latency and complexity, the "fast mode" decoder can have a corresponding error correction capability lower than that of the medium error decoder 650 and the high error decoder 660. As one example, an error correction capability of the low error decoder 640 can be in a range between 200-300 BER or FBC. The low error decoder 640 can also be applied to decode code words with BER or FBC failure estimation values less than the range of the low error decoder.

The medium error decoder 650 can perform a decoding operation on a code word in accordance with a decoding process having one or more particular characteristics. One or more characteristics of the decoding process can depend on structure of the medium error decoder 650. As one example, the medium error decoder 650 can be a "quick-safe mode" decoder, with a power consumption, latency, and complexity, all higher than corresponding features of the low error decoder 640 and lower than corresponding features of the high error decoder 660. In order to achieve the above improvements and efficiencies in power, latency and complexity, the "quick-safe mode" decoder can have a corresponding error correction capability higher than that of the low error decoder 640 and lower than that of the high error decoder 660. As one example, an error correction capability of the medium error decoder 650 can be in a range between 260 and 380 BER or FBC.

The high error decoder 660 can perform a decoding operation on a code word in accordance with a decoding process having one or more particular characteristics. One or more characteristics of the decoding process can depend on structure of the high error decoder 660. As one example, the high error decoder 660 can be a "safe mode" decoder, with a power consumption, latency, and complexity, all higher than corresponding features of the low error decoder 640 and the medium error decoder 650. The "safe mode" decoder can reduce efficiencies in power, latency, and complexity, to have a corresponding error correction capability higher than that of the low error decoder 640 and the medium error decoder 650. As one example, an error correction capability of the low error decoder 640 can be in a range between 270-380 BER or FBC.

Each of the low error decoder 640, the medium error decoder 650, and the high error decoder 660 can include one or more logical or electronic devices including but not limited to integrated circuits, logic gates, flip flops, gate arrays, programmable gate arrays, and the like. It is to be understood that any electrical, electronic, or like devices, or components associated with one or more of the of the low error decoder 640, the medium error decoder 650, and the high error decoder 660 can also be associated with, integrated with, integrable with, or the like, the ECC encoder/decoder 112 or any component thereof. It is to be further understood that one or more of the low error decoder 640, the medium error decoder 650, and the high error decoder 660 can be integrated into a single device, circuit, integrated circuit, or the like. As one example, a selection of one or more of the low error decoder 640, the medium error decoder 650, and the high error decoder 660 can include a selection of one or more portions of the single device, circuit, or integrated circuit corresponding to one or more selected decoders 640, 650 and 660.

The output node 604 can provide a decoded code word to one or more of the host 101 and the memory array 120. The output node 604 can be operatively coupled to one or more of the host 101 and the memory array 120 by one or more communication channels. The communication channels can include one or more digital, analog, or like communication lines, traces, or the like. As one example, the communication channels include at least one serial or parallel communication line among multiple communication lines of a communication interface.

Figure 7:
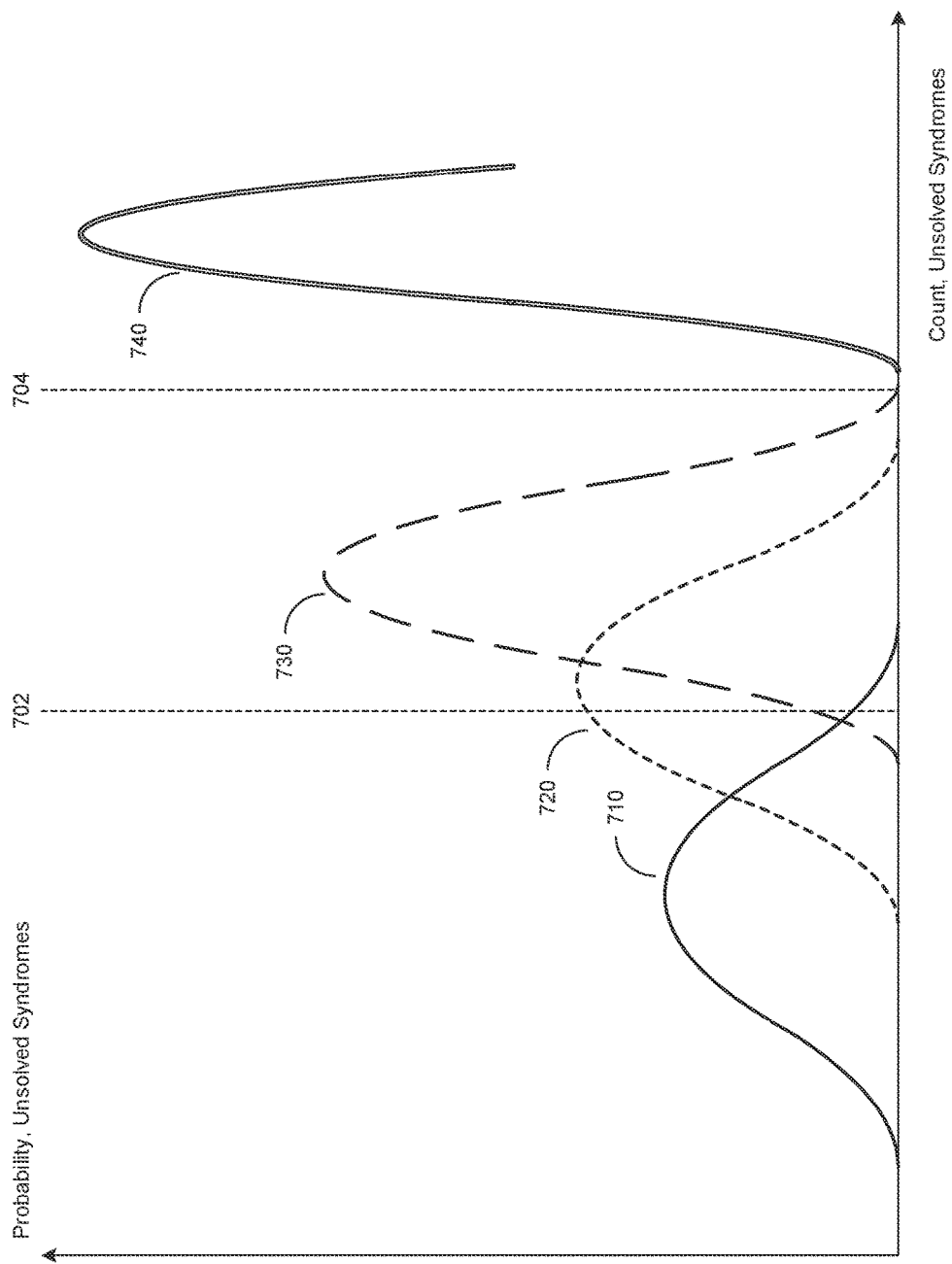
FIG. 7 illustrates a first threshold distribution, in accordance with present implementations.

FIG. 7 illustrates a first threshold distribution further to the system of FIG. 6. As illustrated by way of example in FIG. 7, threshold distribution 700 can include a first curve 710 corresponding to a first failure probability, a second curve 720 corresponding to a second failure probability, a third curve 730 corresponding to a third failure probability, a fourth curve 740 corresponding to a fourth failure probability, a first threshold 702 corresponding to a first number of unsolved syndromes, and a second threshold 704 corresponding to a second number of unsolved syndromes. As one example, the solved syndrome calculation cell 610 can operate in accordance with one or more of the curves 710, 720, 730 and 740. As another example, the solved syndrome calculation cell 610 can operate in accordance with one or more of the thresholds 702 and 704.

The first curve 710 can indicate, for a code word having a first BER or FBC, a probability of failure of decoding the code word over a first range of counts of unsolved syndromes. As one example, a first BER or FBC can be 100. The second curve 720 can indicate, for a code word having a second BER or FBC, a probability of failure of decoding the code word over a second range of counts of unsolved syndromes. As one example, a second BER or FBC can be 125. The third curve 730 can indicate, for a code word having a third BER or FBC, a probability of failure of decoding the code word over a third range of counts of unsolved syndromes. As one example, a third BER or FBC can be 150. The fourth curve 740 can indicate, for a code word having a fourth BER or FBC, a probability of failure of decoding the code word over a fourth range of counts of unsolved syndromes. As one example, a fourth BER or FBC can be 200.

The first threshold 702 can indicate a count of unsolved syndromes, and can inform a determination by the decoder selector to select one or more of the decoders 640, 650 and 660. As one example, the decoder selector 630 can select the low error decoder 640 if the count associated with the first threshold 702 is greater than the count of unsolved syndromes associated with the particular code word to be decoded. The decoder selector 630 can select a plurality of decoders in a sequential order based on the first threshold 702. As one example, the decoder selector 630 can select the decoders 640, 650 and 660 in a decoder order to sequentially attempt decoding of the code word, if the count associated with the first threshold 702 is greater than the count of unsolved syndromes associated with the particular code word to be decoded. As another example, the decoder selector 630 can select the decoders 650 and 660 in a decoder order to sequentially attempt decoding of the code word, if the count associated with the first threshold 702 is less than the count of unsolved syndromes associated with the particular code word to be decoded. Thus, the decoder selector 630 can choose to bypass decoding by the low error decoder 640 based on the first threshold 702. As one example, the first threshold can correspond to a count of 107. The first threshold 702 can be predetermined or experimentally determined, for example.

The second threshold 704 can indicate a count of unsolved syndromes higher than a count associated with the first threshold 702, and can inform a determination by the decoder selector to select one or more of the decoders 640, 650 and 660. As one example, the decoder selector 630 can select the medium error decoder 650 if the count associated with the second threshold 704 is greater than the count of unsolved syndromes associated with the particular code word to be decoded. The decoder selector 630 can select a plurality of decoders in a sequential order based on the second threshold 704. As one example, the decoder selector 630 can select the decoders 650 and 660 in a decoder order to sequentially attempt decoding of the code word, if the count associated with the second threshold 704 is greater than the count of unsolved syndromes associated with the particular code word to be decoded. As another example, the decoder selector 630 can select the decoder 660 in a decoder order to sequentially attempt decoding of the code word, if the count associated with the second threshold 704 is less than the count of unsolved syndromes associated with the particular code word to be decoded. Thus, the decoder selector 630 can choose to bypass decoding by the low error decoder 640 based on the first threshold 702. As one example, the second threshold 704 can correspond to a count of 119. The second threshold 704 can be predetermined or experimentally determined, for example. A higher number of unsolved syndromes can thus correspond to a higher BER or FBC.

As one example, the first threshold 702 can be based on a half-product code with 128 code components, where each code component is BCH code component. Here, a total frame size can equal 4584 bytes, a payload size can equal 4112 bytes, and a redundancy can equal 472 bytes. Thus, where the count of unsolved syndromes is less than the first threshold 702, at 107 unsolved syndromes, a probability that FBC or BER is 100 is 99%. The first curve 710 can indicate this probability based on the percentage of the curve to either side of the first threshold 702. Similarly, where the count of unsolved syndromes is less than the first threshold 702, at 107 unsolved syndromes, a probability that FBC or BER is 150 is 1%. The third curve 710 can indicate this probability based on the percentage of the curve to either side of the first threshold 702. Thus, the decoder selector 630 can, for example, begin decoding with the low error decoder 640 in response to determining that a code word has a count of unsolved syndromes less than 107 under an assumption that the BER or FBC is relatively low based on the count of unsolved syndromes below the first threshold 702. The decoder selector 630 can further, for example, begin decoding with the high error decoder 660 in response to determining that a code word has a count of unsolved syndromes greater than 107 under an assumption that the BER or FBC is relatively high based on the count of unsolved syndromes above the first threshold 702. It is to be understood that the decoder selector 630 can store any number of thresholds. It is to be further understood that the decoder selector 630 can select any decoder based on satisfaction of any number of combination of thresholds, and is not limited to selection of a decoder based on the examples herein.

Figure 8:
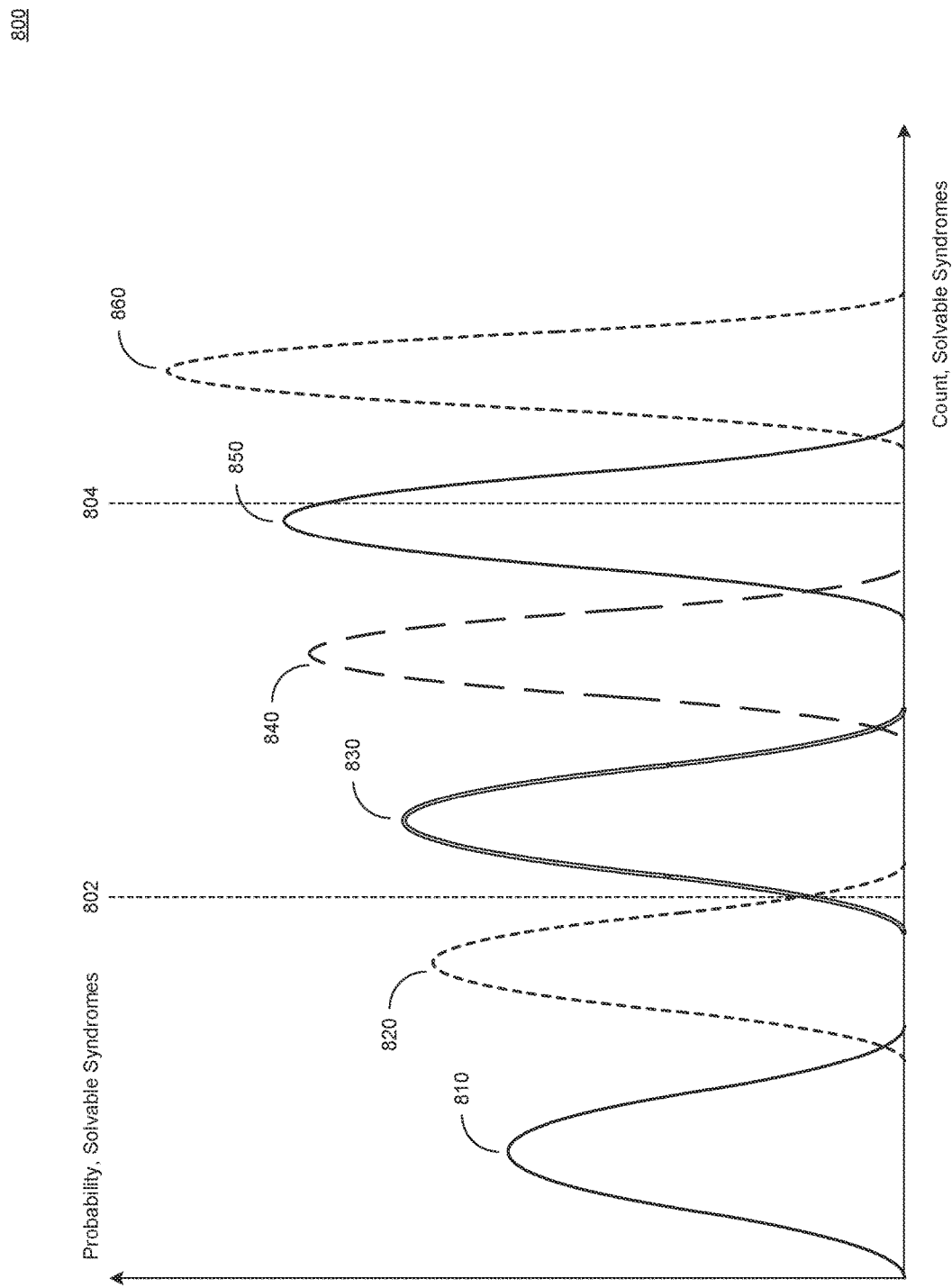
FIG. 8 illustrates a second threshold distribution, in accordance with present implementations.

FIG. 8 illustrates a second threshold distribution further to the system of FIG. 6. As illustrated by way of example in FIG. 8, threshold distribution 800 can include a first curve 810 corresponding to a first failure probability, a second curve 820 corresponding to a second failure probability, a third curve 830 corresponding to a third failure probability, a fourth curve 840 corresponding to a fourth failure probability, a fifth curve 850 corresponding to a fifth failure probability, a sixth curve 860 corresponding to a sixth failure probability, a first threshold 802 corresponding to a first number of solvable syndromes, and a second threshold 804 corresponding to a second number of solvable syndromes. As one example, the solvable syndrome calculation cell 620 can operate in accordance with one or more of the curves 810, 820, 830, 840, 850 and 860. As another example, the solvable syndrome calculation cell 620 can operate in accordance with one or more of the thresholds 802 and 804.

The first curve 810 can indicate, for a code word having a first BER or FBC, a probability of failure of decoding the code word over a first range of counts of solvable syndromes. Solvable syndromes can correspond to syndromes to which a solution exists. As one example, a first BER or FBC can be 240. The second curve 820 can indicate, for a code word having a first BER or FBC, a probability of failure of decoding the code word over a second range of counts of solvable syndromes. As one example, a second BER or FBC can be 220. The third curve 830 can indicate, for a code word having a first BER or FBC, a probability of failure of decoding the code word over a third range of counts of solvable syndromes. As one example, a third BER or FBC can be 200. The fourth curve 840 can indicate, for a code word having a first BER or FBC, a probability of failure of decoding the code word over a fourth range of counts of solvable syndromes. As one example, a fourth BER or FBC can be 180. The fifth curve 850 can indicate, for a code word having a first BER or FBC, a probability of failure of decoding the code word over a fifth range of counts of solvable syndromes. As one example, a fifth BER or FBC can be 160. The sixth curve 860 can indicate, for a code word having a first BER or FBC, a probability of failure of decoding the code word over a sixth range of counts of solvable syndromes. As one example, a sixth BER or FBC can be 140. Thus, the decoder selector 630 can select a decoder of increasing complexity as the first decoder to attempt to decode a code word, as the number of solvable syndromes decreases. Thus, the lower the number of solvable syndromes, the higher the likely BER or FBC of a particular code word.

The first threshold 802 can indicate a count of solvable syndromes, and can inform a determination by the decoder selector to select one or more of the decoders 640, 650 and 660. As one example, the decoder selector 630 can select the low error decoder 640 if the count associated with the first threshold 802 is less than the count of solvable syndromes associated with the particular code word to be decoded. The decoder selector 630 can select a plurality of decoders in a sequential order based on the first threshold 802. As one example, the decoder selector 630 can select the decoders 640, 650 and 660 in a decoder order to sequentially attempt decoding of the code word, if the count associated with the first threshold 802 is greater than the count of solvable syndromes associated with the particular code word to be decoded. As another example, the decoder selector 630 can select the decoders 650 and 660 in a decoder order to sequentially attempt decoding of the code word, if the count associated with the first threshold 802 is greater than the count of solvable syndromes associated with the particular code word to be decoded. Thus, the decoder selector 630 can choose to bypass decoding by the low error decoder 640 based on the first threshold 802. As one example, the first threshold can correspond to a count of 78. The first threshold 802 can be predetermined or experimentally determined, for example.

The second threshold 804 can indicate a count of solvable syndromes lower than a count associated with the first threshold 802, and can inform a determination by the decoder selector to select one or more of the decoders 640, 650 and 660. As one example, the decoder selector 630 can select the medium error decoder 650 if the count associated with the second threshold 804 is less than the count of unsolved syndromes associated with the particular code word to be decoded. The decoder selector 630 can select a plurality of decoders in a sequential order based on the second threshold 804. As one example, the decoder selector 630 can select the decoders 650 and 660 in a decoder order to sequentially attempt decoding of the code word, if the count associated with the second threshold 804 is less than the count of solvable syndromes associated with the particular code word to be decoded. As another example, the decoder selector 630 can select the decoder 660 in a decoder order to sequentially attempt decoding of the code word, if the count associated with the second threshold 804 is higher than the count of solvable syndromes associated with the particular code word to be decoded. Thus, the decoder selector 630 can choose to bypass decoding by the low error decoder 640 based on the second threshold 804. As one example, the second threshold 804 can correspond to a count of 119. The second threshold 804 can be predetermined or experimentally determined, for example. A lower number of solvable syndromes can thus correspond to a higher BER or FBC.

As one example, the first threshold 804 can be based on a half-product code with 128 code components, where each code component is BCH code component, correspondingly to the first threshold 702. Thus, where the count of solvable syndromes is greater than the first threshold 802, at 78 solvable syndromes, a probability that FBC or BER is 240 is 99%. The second curve 820 can indicate this probability based on the percentage of the curve to either side of the first threshold 802. Similarly, where the count of solvable syndromes is greater than the first threshold 802, at 78 solvable syndromes, a probability that FBC or BER is 240 is 0.01%. The second curve 820 can indicate this probability based on the percentage of the curve to either side of the first threshold 802. Thus, the decoder selector 630 can, for example, begin decoding with the low error decoder 640 in response to determining that a code word has a count of solvable syndromes greater than 78 under an assumption that the BER or FBC is relatively low based on the count of solvable syndromes above the first threshold 802. The decoder selector 630 can further, for example, begin decoding with the high error decoder 660 in response to determining that a code word has a count of solvable syndromes less than 78 under an assumption that the BER or FBC is relatively high based on the count of solvable syndromes below the first threshold 802. It is to be understood that the decoder selector 630 can store any number of thresholds. It is to be further understood that the decoder selector 630 can select any decoder based on satisfaction of any number of combination of thresholds, and is not limited to selection of a decoder based on the examples herein.

Figure 9:
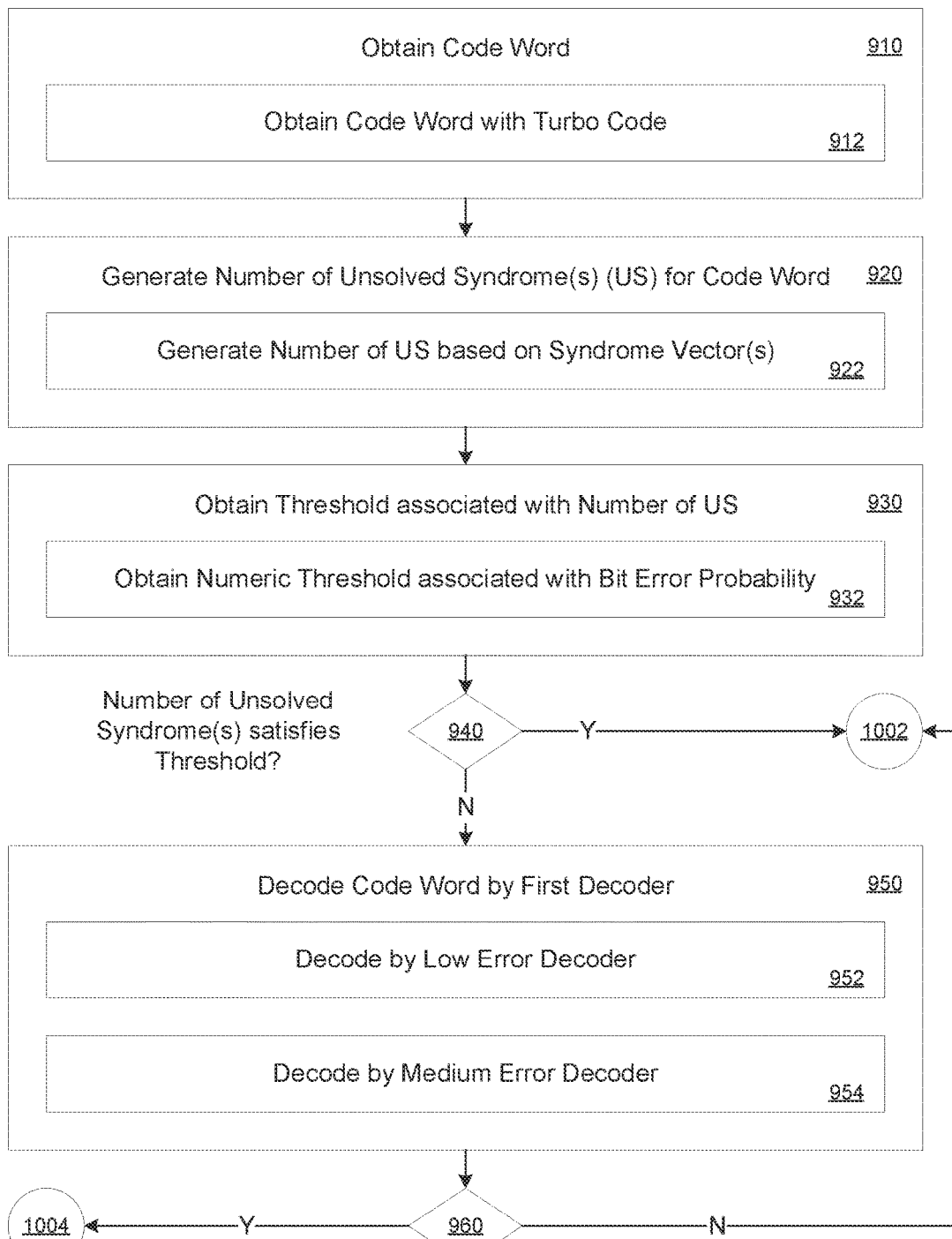
FIG. 9 illustrates a first method of decoding error correction code of a memory device with dynamic bit error estimation based on unsolved syndromes, in accordance with present implementations.

FIG. 9 illustrates a first method of decoding error correction code of a memory device with dynamic bit error estimation based on unsolved syndromes, in accordance with present implementations. At least one of the non-volatile storage device 100 and the system 600 can perform method 900 according to present implementations. The method 900 can begin at 910.

At 910, the method can obtain a code word. 910 can include 912. At 912, the method can obtain a code word including a turbo code. The method 900 can then continue to 920.

At 920, the method can generate a number corresponding to one or more unsolved syndromes associated with the code word. 920 can include 922. At 922, the method can generate a number corresponding to one or more unsolved syndromes based on at least one syndrome vector. The method 900 can then continue to 930.

At 930, the method can obtain at least one threshold associated with the number of unsolved syndromes. 930 can include 932. At 932, the method can obtain at least one numeric threshold associated with a bit error probability. The threshold can correspond to at least one of thresholds 702 and 704. The method 900 can then continue to 940.

At 940, the method can determine whether the number of unsolved syndromes satisfies the threshold. In accordance with a determination that the number of unsolved syndromes satisfies the threshold, the method 900 can continue to 1002. Alternatively, in accordance with a determination that the number of unsolved syndromes does not satisfy the threshold, the method 900 can continue to 950.

At 950, the method can decode the code word by a first decoder. The first decoder can have a lower complexity or a lowest complexity for example, and can be one of the low error decoder 640 and the medium error decoder 650. 950 can include at least one of 952 and 954. At 952, the method can decode the code word by a low error decoder. At 954, the method can decode the code word by the medium error decoder. The method 900 can then continue to 960.

At 960, the method can determine whether decoding by the first decoder is successful. In accordance with a determination that decoding by the first decoder is successful, the method 900 can continue to 1004. Alternatively, in accordance with a determination that decoding by the first decoder is not successful, the method 900 can continue to 1002.

Figure 10:
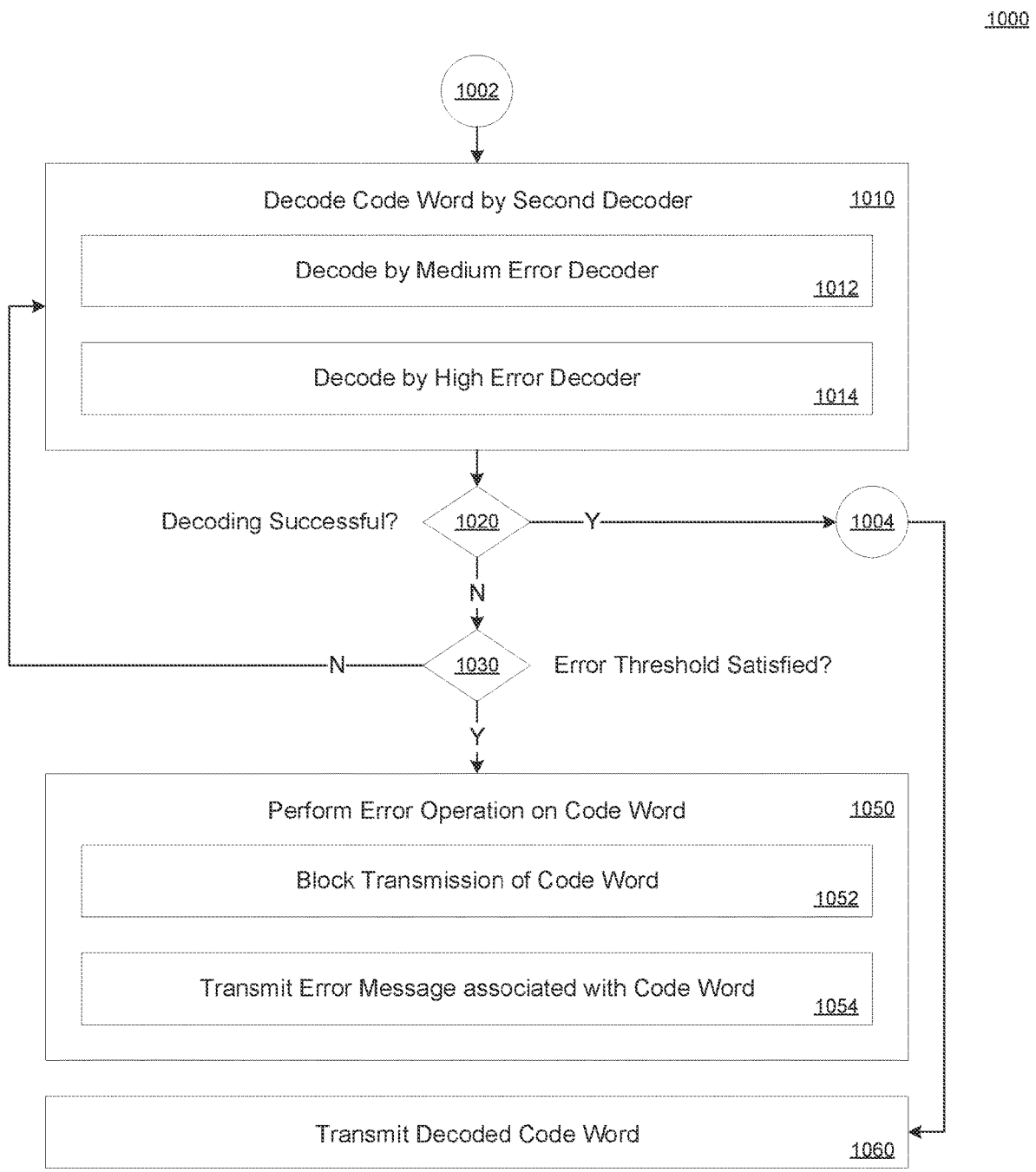
FIG. 10 illustrates a second method of decoding error correction code of a memory device with dynamic bit error estimation based on unsolved syndromes, in accordance with present implementations.

FIG. 10 illustrates a second method of decoding error correction code of a memory device with dynamic bit error estimation based on unsolved syndromes, further to the method of FIG. 9. At least one of the non-volatile storage device 100 and the system 600 can perform method 1000 according to present implementations. The method 1000 can begin at 1002. The method 1000 can then continue to 1010.

At 1010, the method can decode the code word by a second decoder. The second decoder can have a complexity higher than the first decoder. As one example, if the decoder selector 630 selects the low error decoder 640 as the first decoder, then the decoder selector 630 can select the medium error decoder 650 or the high error decoder 660 as the second decoder. As another example, if the decoder selector 630 selects the medium error decoder 650 as the first decoder, then the decoder selector 630 can select the high error decoder 660 as the second decoder. 1010 can include at least one of 1012 and 1014. At 1012, the method can decode the code word by the medium error decoder. At 1014, the method can decode the code word by the high error decoder. The method 1000 can then continue to 1020.

At 1020, the method can determine whether decoding by the second decoder is successful. In accordance with a determination that decoding by the second decoder is successful, the method 1000 can continue to 1004. At 1004, the method 1000 can then continue to 1060. Alternatively, in accordance with a determination that decoding by the second decoder is not successful, the method 1000 can continue to 1030.

At 1030, the method can determine whether an error threshold is satisfied. An error threshold can correspond to a restriction on reattempting a decoding operation with respect to a code word. As one example, an error threshold can include a number of failed attempts to decode a code word. Thus, a code word that cannot be decoded by one or more of the decoders within a certain number of attempts can be blocked from further transmission. As another example, an error threshold can include a maximum allotted time to decode a code word. Thus, a code word that cannot be decoded by one or more of the decoders within a certain allotted time can be blocked from further transmission. In accordance with a determination that the error threshold is satisfied, the method 1000 can continue to 1050. Alternatively, in accordance with a determination that the error threshold is not satisfied, the method 1000 can continue to 1010.

At 1050, the method can perform an error operation on the code word. An error operation can include an action to modify transmission of the code word, and can include an action to transmit additional information based on the failure to decode the code word successfully. 1050 can include at least one of 1052 and 1054. At 1052, the method can block transmission of at least one code word. The method can, for example, block the code word from being transmitted further to or toward the memory array 120, to prevent information associated the unsuccessfully decoded code word from corrupting a memory. At 1054, the method can transmit at least the error message associated with the code word. The method 1000 can end at 1050.

At 1060, the method can transmit the decoded code word. The controller 110 can transmit the decoded code word, or send a transmission based on the decoded code word, to the memory array 120, for example. The method 1000 can end at 1060.

Figure 11:
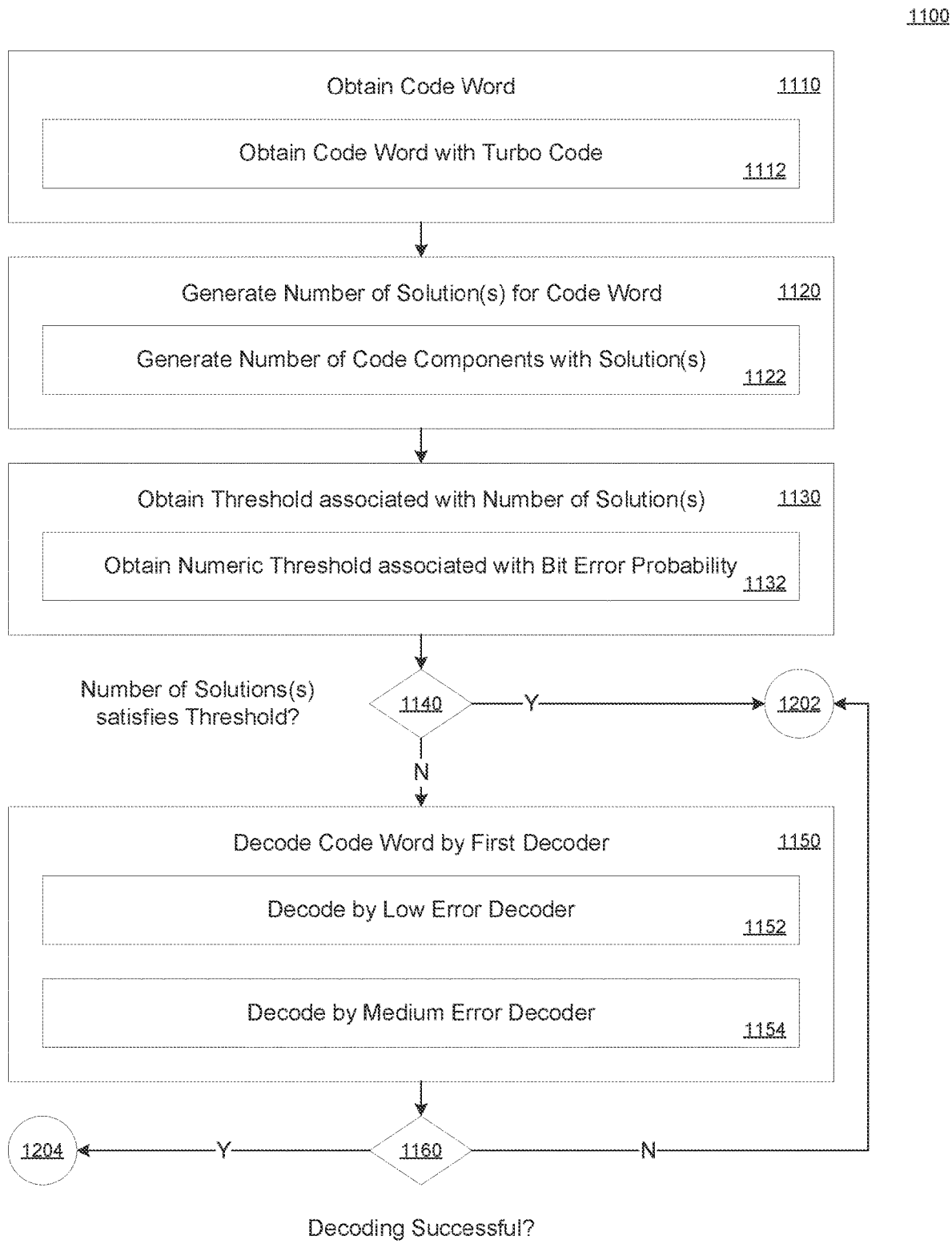
FIG. 11 illustrates a first method of decoding error correction code of a memory device with dynamic bit error estimation based on solvable syndromes, in accordance with present implementations.

FIG. 11 illustrates a first method of decoding error correction code of a memory device with dynamic bit error estimation based on solvable syndromes, in accordance with present implementations. At least one of the non-volatile storage device 100 and the system 600 can perform method 1100 according to present implementations. The method 1100 can begin at 1110.

At 1110, the method can obtain a code word. 1110 can include 1112. At 1112, the method can obtain a code word including a turbo code. The method 1100 can then continue to 1120.

At 1120, the method can generate a number corresponding to one or more solutions of syndromes associated with the code word. Solutions can correspond to output in accordance with one or more solution modes as discussed above. Solutions of syndromes can correspond to the solvable syndromes associated with a particular code word. 1120 can include 1122. At 1122, the method can generate a number corresponding to one or more solutions of syndromes associated with corresponding code components. The method 1100 can then continue to 1130.

At 1130, the method can obtain at least one threshold associated with the number of solutions associated with corresponding syndromes. 1130 can include 1132. At 1132, the method can obtain at least one numeric threshold associated with a bit error probability. The threshold can correspond to one or more of thresholds 802 and 804. The method 1100 can then continue to 1140.

At 1140, the method can determine whether the number of solutions satisfies the threshold. In accordance with a determination that the number of solutions satisfies the threshold, the method 1100 can continue to 1202. Alternatively, in accordance with a determination that the number of solutions does not satisfy the threshold, the method 1100 can continue to 1150.

At 1150, the method can decode the code word by a first decoder. 1550 can correspond at least partially to 950. 1150 can include at least one of 1152 and 1154. At 1152, the method can decode the code word by a low error decoder. At 1154, the method can decode the code word by the medium error decoder. The method 1100 can then continue to 1160.

At 1160, the method can determine whether decoding by the first decoder is successful. In accordance with a determination that decoding by the first decoder is successful, the method 1100 can continue to 1204. Alternatively, in accordance with a determination that decoding by the first decoder is not successful, the method 1100 can continue to 1202.

Figure 12:
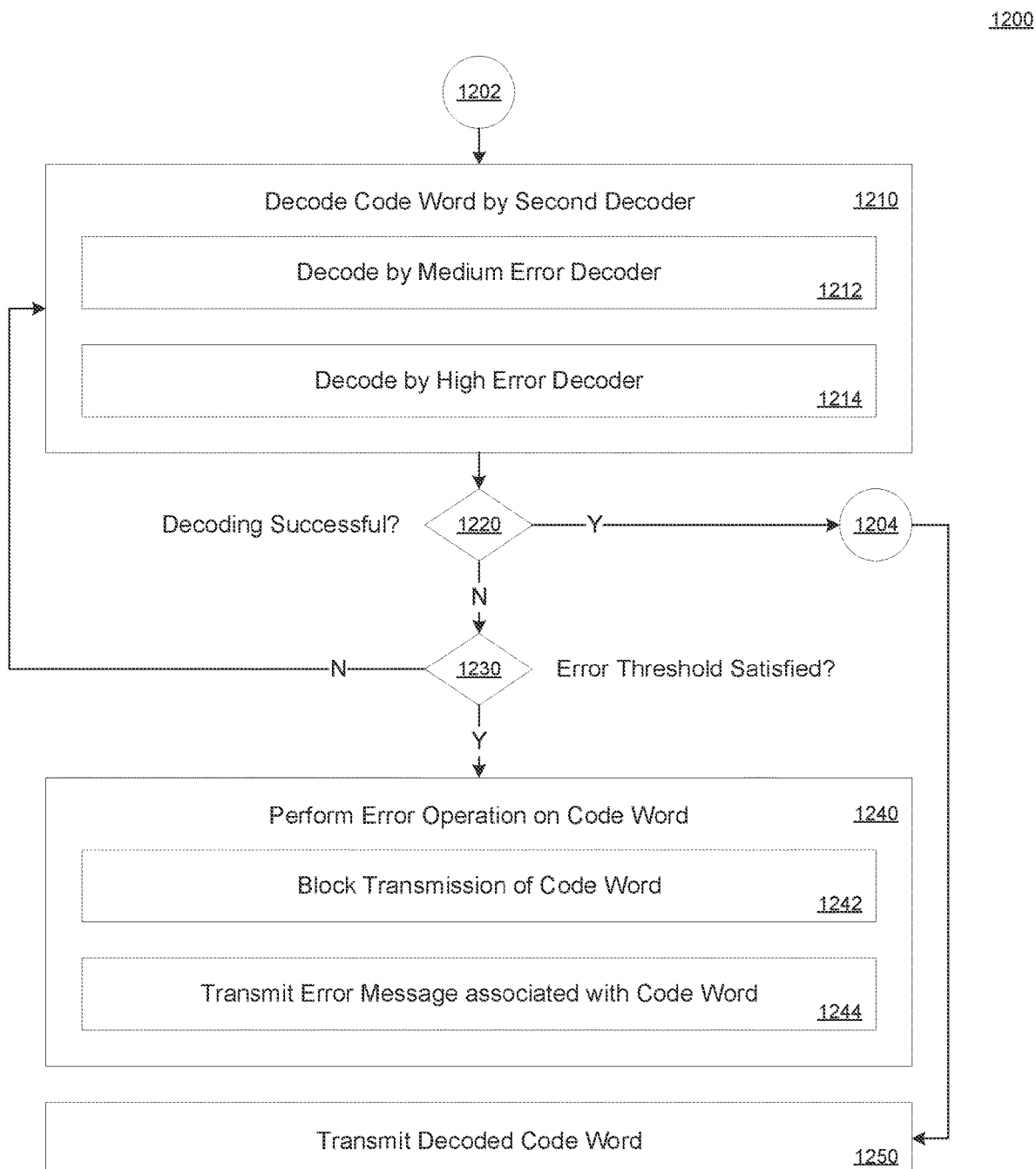
FIG. 12 illustrates a second method of decoding error correction code of a memory device with dynamic bit error estimation based on solvable syndromes, in accordance with present implementations.

FIG. 12 illustrates a second method of decoding error correction code of a memory device with dynamic bit error estimation based on solvable syndromes, further to the method of FIG. 11. The method 1200 can begin at 1202. The method 1200 can then continue to 1210.

At 1210, the method can decode the code word by a second decoder. 1210 can correspond at least partially to 1010. 1210 can include at least one of 1212 and 1214. At 1212, the method can decode the code word by the medium error decoder. At 1214, the method can decode the code word by the high error decoder. The method 1200 can then continue to 1220.

At 1220, the method can determine whether decoding by the second decoder is successful. In accordance with a determination that decoding by the second decoder is successful, the method 1200 can continue to 1204. At 1204, the method 1200 can then continue to 1260. Alternatively, in accordance with a determination that decoding by the second decoder is not successful, the method 1200 can continue to 1230.

At 1230, the method can determine whether an error threshold is satisfied. 1230 can correspond at least partially to 1030. In accordance with a determination that the error threshold is satisfied, the method 1200 can continue to 1250. Alternatively, in accordance with a determination that the error threshold is not satisfied, the method 1200 can continue to 1210.

At 1240, the method can perform an error operation on the code word. 1240 can correspond at least partially to 1050. 1240 can include at least one of 1242 and 1244. At 1242, the method can block transmission of at least one code word. At 1244, the method can transmit at least the error message associated with the code word. The method 1200 can end at 1240. At 1250, the method can transmit the decoded code word. The method 1200 can end at 1260.

Figure 13:
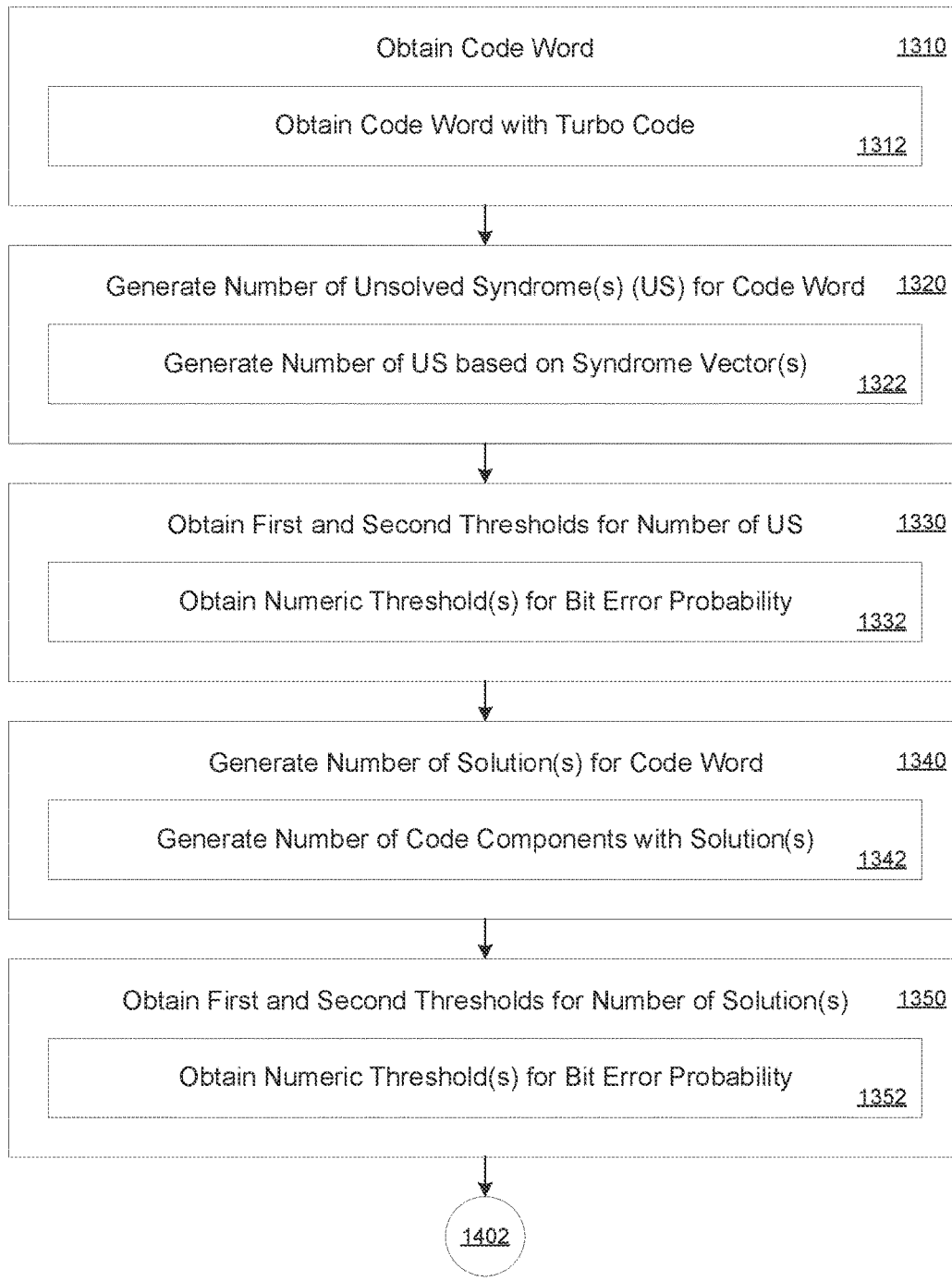
FIG. 13 illustrates a first method of decoding error correction code of a memory device with dynamic bit error estimation based on one or more of unsolved syndromes and solvable syndromes, in accordance with present implementations.

FIG. 13 illustrates a first method of decoding error correction code of a memory device with dynamic bit error estimation based on one or more of unsolved syndromes and solvable syndromes, in accordance with present implementations. At least one of the non-volatile storage device 100 and the system 600 can perform method 1300 according to present implementations. The method 1300 can begin at 1310.

As an arrangements, a combination of both number of unsolved-syndromes and number of CBS (Can be solved) syndromes can be used. Even though there is a correlation between number of unsolved-syndromes and CBS indication, a combination of both may provide a better resolution. Regarding the process of extracting an indication of can-be-solved (CBS) syndromes, including a number of solvable syndromes, later used for BER estimation, an example for computing the can-be-solved (CBS) of a BCH code component from its syndrome can include a direct computation of its error-locating-polynomial (ELP) and a determination whether the ELP may be solvable. All of this can be done directly from syndromes.

At 1310, the method can obtain a code word. 1310 can include 1312. At 1312, the method can obtain a code word including a turbo code. The method 1300 can then continue to 1320.

At 1320, the method can generate a number corresponding to one or more unsolved syndromes associated with the code word. 1320 can include 1322. At 1322, the method can generate a number corresponding to one or more unsolved syndromes based on at least one syndrome vector. The method 1300 can then continue to 1330.

At 1330, the method can obtain a first threshold and a second threshold each associated with the number of unsolved syndromes. 1330 can include 1332. At 1332, the method can obtain at least one numeric threshold associated with a bit error probability. As one example, the first threshold can correspond to the first threshold 702 and the second threshold can correspond to the first threshold 802. The method 1300 can then continue to 1340.

At 1340, the method can generate a number corresponding to one or more solutions of syndromes associated with the code word. 1120 can include 1122. At 1122, the method can generate a number corresponding to one or more solutions of syndromes associated with corresponding code components. The method 1300 can then continue to 1350.

At 1350, the method can obtain a first threshold and a second threshold each associated with the number of solutions associated with corresponding syndromes. 1350 can include 1352. At 1352, the method can obtain at least one numeric threshold associated with a bit error probability. The method 1300 can then continue to 1402.

Figure 14:
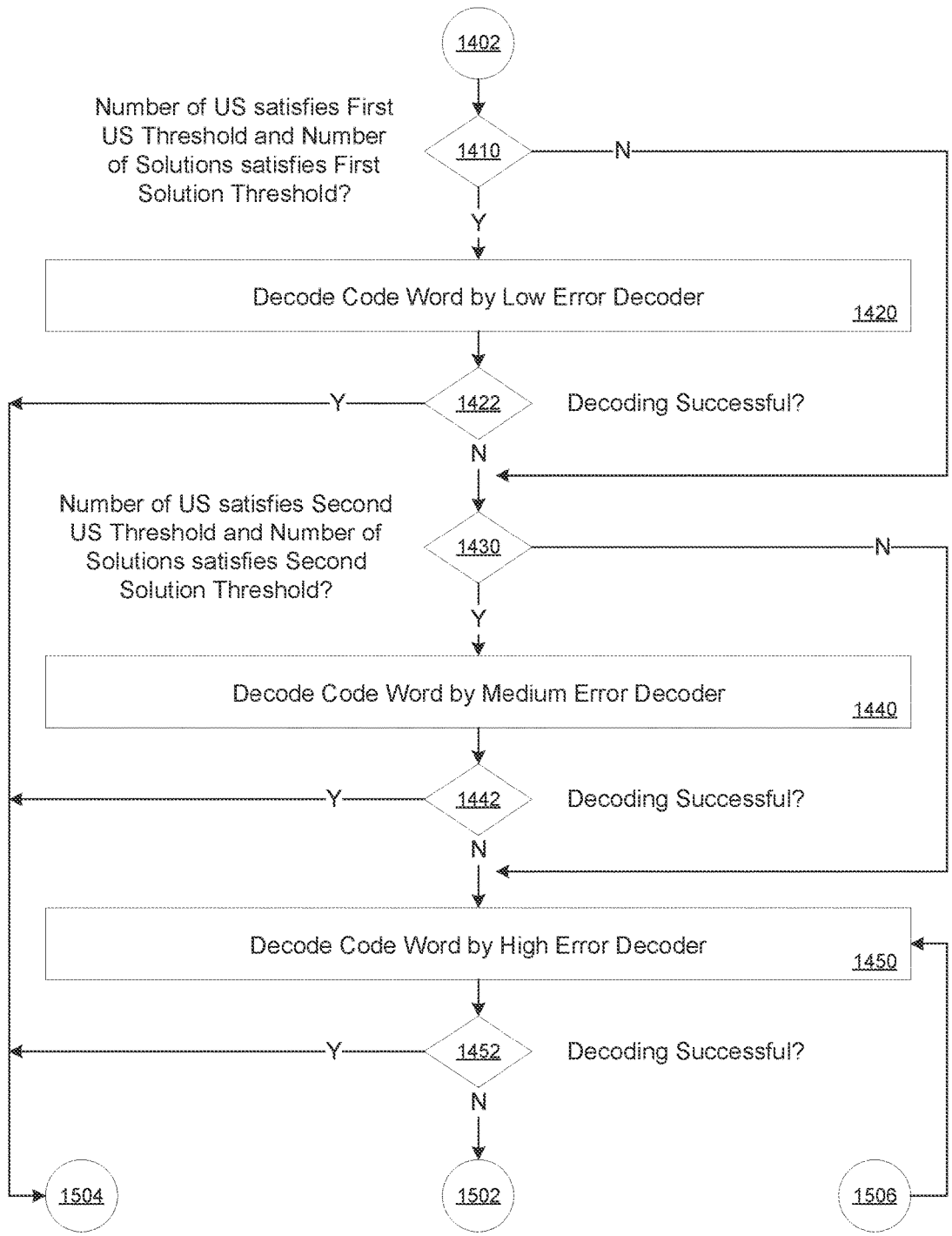
FIG. 14 illustrates a second method of decoding error correction code of a memory device with dynamic bit error estimation based on one or more of unsolved syndromes and solvable syndromes, in accordance with present implementations.

FIG. 14 illustrates a second method of decoding error correction code of a memory device with dynamic bit error estimation based on one or more of unsolved syndromes and solvable syndromes, further to the method of FIG. 13. At least one of the non-volatile storage device 100 and the system 600 can perform method 1400 according to present implementations. The method 1400 can begin at 1402. The method 1400 can then continue to step 1410.

At 1410, the method can determine whether a number of unsolved syndromes satisfies a first threshold associated with unsolved syndromes, and a number of solutions satisfies a first threshold associated with solutions of syndromes of the code word. As one example, the method can determine whether a number of unsolved syndromes of a code word is less than the threshold 702, and a number of solvable syndromes of the code word is greater than the threshold 802. Thus, the method can determine whether a low BER or FBC code word is encountered based on determining whether both the unsolved syndrome and solvable syndrome thresholds indicate low BER or FBC. In accordance with a determination that a number of unsolved syndromes satisfies a first threshold associated with unsolved syndromes, and a number of solutions satisfies a first threshold associated with solutions of syndromes of the code word, the method 1400 can continue to 1420. Alternatively, in accordance with a determination that at least one of a number of unsolved syndromes does not satisfy a first threshold associated with unsolved syndromes, and a number of solutions does not satisfy a first threshold associated with solutions of syndromes of the code word, the method 1400 can continue to 1430.

At 1420, the method can decode the code word by a low error decoder. The method 1400 can then continue to 1422.

At 1422, the method can determine whether decoding by the low error decoder is successful. In accordance with a determination that decoding by the low error decoder is successful, the method 1400 can continue to 1504. Alternatively, in accordance with a determination that decoding by the low error decoder is not successful, the method 1400 can continue to 1430.

At 1430, the method can determine whether a number of unsolved syndromes satisfies a second threshold associated with unsolved syndromes, and a number of solutions satisfies a second threshold associated with solutions of syndromes of the code word. As one example, the method can determine whether a number of unsolved syndromes of a code word is greater than the threshold 702, and a number of solvable syndromes of the code word is less than the threshold 802. Thus, the method can determine whether a high BER or FBC code word is encountered based on determining whether both the unsolved syndrome and solvable syndrome thresholds indicate high BER or FBC. In accordance with a determination that a number of unsolved syndromes satisfies a second threshold associated with unsolved syndromes, and a number of solutions satisfies a second threshold associated with solutions of syndromes of the code word, the method 1400 can continue to 1440. Alternatively, in accordance with a determination that at least one of a number of unsolved syndromes does not satisfy a second threshold associated with unsolved syndromes, and a number of solutions does not satisfy a second threshold associated with solutions of syndromes of the code word, the method 1400 can continue to 1450.

At 1440, the method can decode the code word by a medium error decoder. The method 1400 can then continue to 1442.

At 1442, the method can determine whether decoding by the medium error decoder is successful. In accordance with a determination that decoding by the medium error decoder is successful, the method 1400 can continue to 1504. Alternatively, in accordance with a determination that decoding by the medium error decoder is not successful, the method 1400 can continue to 1450.

At 1450, the method can decode the code word by a high error decoder. The method 1400 can then continue to 1452.

At 1452, the method can determine whether decoding by the high error decoder is successful. In accordance with a determination that decoding by the high error decoder is successful, the method 1400 can continue to 1504. Alternatively, in accordance with a determination that decoding by the high error decoder is not successful, the method 1400 can continue to 1502.

Figure 15:
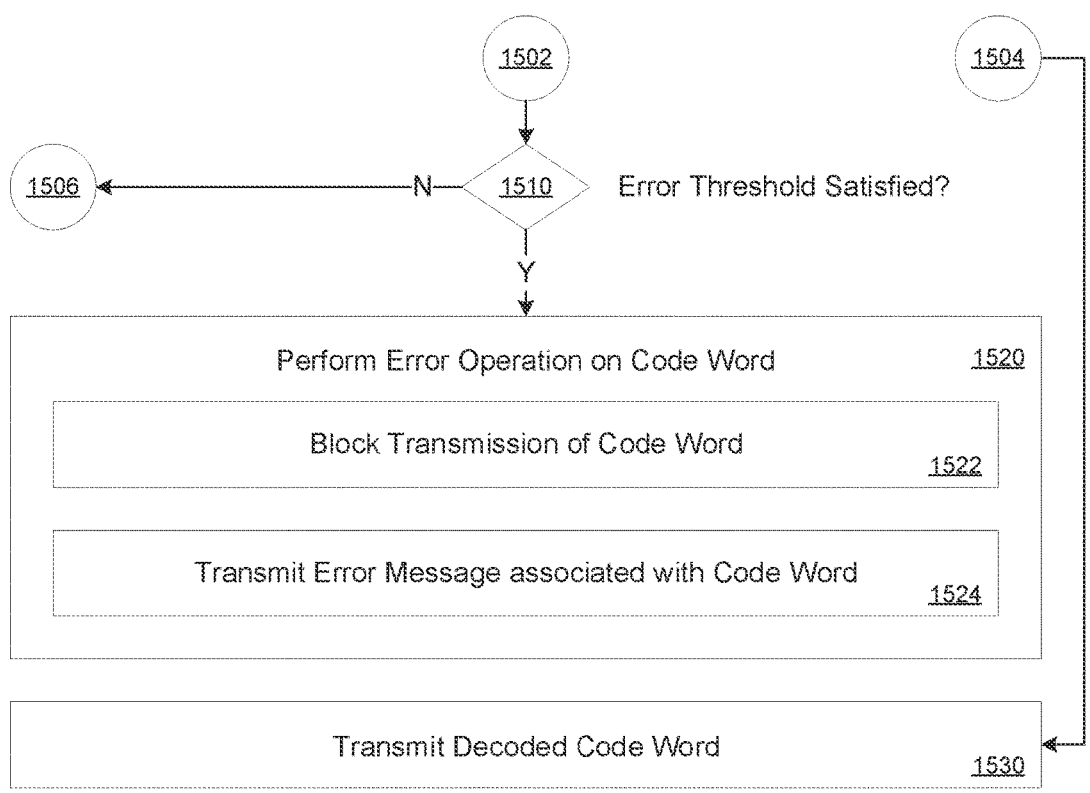
FIG. 15 illustrates a third method of decoding error correction code of a memory device with dynamic bit error estimation based on one or more of unsolved syndromes and solvable syndromes, in accordance with present implementations.

FIG. 15 illustrates a third method of decoding error correction code of a memory device with dynamic bit error estimation based on one or more of unsolved syndromes and solvable syndromes further to the method of FIG. 14. At least one of the non-volatile storage device 100 and the system 600 can perform method 1500 according to present implementations. The method 1500 can begin at 1502. The method 1500 can then continue to 1510.

At 1510, the method can determine whether an error threshold is satisfied. In accordance with a determination that an error threshold is satisfied, the method 1500 can continue to 1520. Alternatively, in accordance with a determination that an error threshold is not satisfied, the method 1500 can continue to 1506. At 1506, the method can continue to 1450.

At 1520, the method can perform an error operation on the code word. 1520 can correspond at least partially to 1050. 1520 can include at least one of 1522 and 1524. At 1522, the method can block transmission of at least one code word. At 1524, the method can transmit at least the error message associated with the code word. The method 1500 can end at 1520. At 1530, the method can transmit the decoded code word. The method 1500 can end at 1530.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative implementations has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. A method of decoding error correction code of a memory device with dynamic bit error estimation, the method comprising:
    generating at least one metric corresponding to one or more syndromes associated with a code word, the code word comprising an error correction code of a memory device, wherein generating the at least one metric comprises determining a number of unsolved syndromes associated with the code word;
    decoding the code word by a first decoder integrated with the memory device in response to a determination that the number is less than a first threshold number of unsolved syndromes, the first decoder having a first execution property and having a first device complexity corresponding to a first bit correction capability; and
    decoding the code word by a second decoder integrated with the memory device in response to a determination that the number is not less than the first threshold number of unsolved syndromes, the second decoder having a second execution property distinct from the first execution property and having a second device complexity higher than the first device complexity corresponding to a second bit correction capability higher than the first bit correction capability;
    generating at least one second metric corresponding to the syndromes associated with the code word; and
    decoding the code word by the first decoder, in response to the determination that the number is less than the first threshold number of unsolved syndromes, and in response to a determination the second metric satisfies a second threshold.

2. The method of claim 1, wherein the metric corresponds to a failure state.

3. The method of claim 1, wherein the metric corresponds to a solvable state.

4. The method of claim 1, wherein the metric corresponds to a failure state, and the second metric corresponds to a number of syndromes associated with the code word and corresponding to a solvable state.

5. The method of claim 1, further comprising:
    decoding the code word by the second decoder, in response to the determination that the number is not less than the first threshold number of unsolved syndromes, and in response to a determination that the metric satisfies a third threshold, and in response to a determination the second metric satisfies a fourth threshold.

6. The method of claim 5, further comprising:
    decoding the code word by a third decoder integrated with the memory device, in response to a determination that the number is not less than the first threshold number of unsolved syndromes, and in response to a determination that the metric does not satisfy the third threshold, and in response to a determination the second metric does not satisfy the second threshold and in response to a determination the second metric does not satisfy the fourth threshold, the third decoder having a third execution property distinct from the first execution property and the second execution property.

7. The method of claim 1, wherein the first execution property corresponds to a first latency associated with the first decoder, and the second execution property corresponds to a second latency associated with the second decoder, the first latency being less than the second latency.

8. A system to decode error correction code of a memory device with dynamic bit error estimation, the system comprising:
    a controller to generate at least one metric corresponding to one or more syndromes associated with a code word, the code word comprising an error correction code of a memory device;
    a first decoder integrated with the memory device, to decode the code word in response to a determination that the metric satisfies a threshold associated with the syndromes, the first decoder having a first execution property; and
    a second decoder integrated with the memory device, to decode the code word in response to a determination that the metric does not satisfy the threshold associated with the syndromes, or in response to a determination that the metric satisfies the threshold associated with the syndromes, and in response to a determination to perform further decoding, the second decoder having a second execution property distinct from the first execution property, wherein the controller is further configured to generate at least one second metric corresponding to the syndromes associated with the code word, and the first decoder is further configured to decode the code word in response to the determination that the metric satisfies the threshold, and in response to a determination the second metric satisfies a second threshold.

9. The system of claim 8, wherein the metric corresponds to a number of syndromes associated with the code word and corresponding to a failure state.

10. The system of claim 8, wherein the metric corresponds to a number of syndromes associated with the code word and corresponding to a solvable state.

11. The system of claim 8, wherein the second metric corresponds to a number of syndromes associated with the code word and corresponding to a solvable state.

12. The system of claim 8, wherein the second decoder is further configured to decode the code word in response to the determination that the metric does not satisfy the threshold, in response to a determination that the metric satisfies a third threshold, and in response to a determination the second metric satisfies a fourth threshold.

13. The system of claim 12, further comprising:
a third decoder integrated with the memory device to decode the code word in response to a determination that the metric does not satisfy the threshold, in response to a determination that the metric does not satisfy the third threshold, in response to a determination the second metric does not satisfy the second threshold and in response to a determination the second metric does not satisfy the fourth threshold, the third decoder having a third execution property distinct from the first execution property and the second execution property.

14. The system of claim 8, wherein the first execution property corresponds to a first latency associated with the first decoder, and the second execution property corresponds to a second latency associated with the second decoder, the first latency being less than the second latency.

15. The system of claim 8, wherein the first execution property corresponds to a first bit correction capability associated with the first decoder, and the second execution property corresponds to a second bit correction capability associated with the second decoder, the first bit correction capability being less than the second bit correction capability.

16. A non-transitory computer readable medium including one or more instructions stored thereon and executable by a processor to:
generate, by the processor, a first metric comprising a number of unsolved syndromes associated with a code word, the code word comprising an error correction code of a memory device;
generate, by the processor, a second metric comprising a number of solvable syndromes associated with the code word;
decode, by the processor, the code word by a first decoder integrated with the memory device, in response to a determination that the first metric is less than a first threshold number of unsolved syndromes the first decoder having a first execution property; and
decode, by the processor, the code word by a second decoder integrated with the memory device, in response to a determination that the first metric is not less than the first threshold number of unsolved syndromes but the second metric is less than a second threshold number of solvable syndromes, the second decoder having a second execution property distinct from the first execution property.

17. The computer readable medium of claim 16, wherein the computer readable medium further includes one or more instructions executable by the processor to:
decode the code word by the first decoder, in response to the determination that the metric is less than the first threshold number of unsolved syndromes, and in response to a determination the second metric is greater than the second threshold number of solvable syndromes.

* * * * *